United States Patent
Maekawa et al.

(10) Patent No.: US 7,153,359 B2
(45) Date of Patent: Dec. 26, 2006

(54) CRYSTALLINE SEMICONDUCTOR FILM AND PRODUCTION METHOD THEREOF, AND SEMICONDUCTOR DEVICE AND PRODUCTION METHOD THEREOF

(75) Inventors: Masashi Maekawa, Nara (JP); Keiichi Fukuyama, Nara (JP); Michinori Iwai, Yamatokooriyama (JP); Kohei Tanaka, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 520 days.

(21) Appl. No.: 10/254,013

(22) Filed: Sep. 25, 2002

(65) Prior Publication Data

US 2003/0061984 A1 Apr. 3, 2003

(30) Foreign Application Priority Data

| Sep. 25, 2001 | (JP) | 2001-292538 |
| Dec. 26, 2001 | (JP) | 2001-394826 |
| Apr. 12, 2002 | (JP) | 2002-111298 |
| Jul. 31, 2002 | (JP) | 2002-223124 |

(51) Int. Cl.
*C30B 13/28* (2006.01)

(52) U.S. Cl. ............ 117/43; 117/44; 117/45; 117/46; 117/47; 117/904; 117/905

(58) Field of Classification Search ........... 117/43, 117/44, 45, 46, 47, 904, 905
See application file for complete search history.

(56) References Cited

U.S. PATENT DOCUMENTS

| 4,661,167 A | * | 4/1987 | Kusunoki et al. ........... 438/479 |
| 4,822,752 A | * | 4/1989 | Sugahara et al. ............. 117/43 |
| 4,870,031 A | * | 9/1989 | Sugahara et al. ........... 438/479 |
| 5,310,446 A | * | 5/1994 | Konishi et al. ............... 117/58 |
| 5,930,609 A | * | 7/1999 | Young ........................ 438/166 |
| 6,322,625 B1 | | 11/2001 | Im |

FOREIGN PATENT DOCUMENTS

| JP | 02-7415 | * | 1/1990 |
| JP | 2000-260709 | | 9/2000 |
| JP | 2001-127302 | | 5/2001 |

OTHER PUBLICATIONS

Sameshima et al, XeCl Excimer Laser Annealing Used in the Fabrication of Poly–Si TFT's, IEEE Electron Device Letters, vol. EDL–7, No. 5, May 1986.
Brotherton et al, "Influence of Melt Depth in Laser Crystallized Poly–Si Thin Film Transistors", J. Appl. Phys. 82(8), Oct. 15, 1997.
Sposili et al, "Sequential Lateral Solidification of Thin Silicon Films on $SiO_2$", Appl. Phys. Lett. 69 (19), Nov. 4, 1996.
Jeon et al, "A New Poly–Si TFT with Selectively Doped Channel Fabricated by Novel Excimer Laser Annealing", 2000 IEEE.
Cheng et al, "High Performance Low–Temperature Processed Polysilicon TFTs Fabricated by Excimer Laser Crystallization with Recessed–Channel Structure", AM–LCD 2000.
Korean Office Action dated Nov. 26, 2006 (w/out English translation).

* cited by examiner

*Primary Examiner*—Robert Kunemund
(74) *Attorney, Agent, or Firm*—Nixon & Vanderhye P.C.

(57) ABSTRACT

A crystalline semiconductor film, the crystalline semiconductor film being formed over an insulative substrate, and including semiconductor crystal grains laterally grown along a surface of the insulative substrate, wherein the laterally-grown semiconductor crystal grains are in contact with each other at grain boundaries, and a distance between adjacent grain boundaries is equal to or smaller than two times a lateral growth distance of the semiconductor crystal grains.

32 Claims, 22 Drawing Sheets

FIG.5
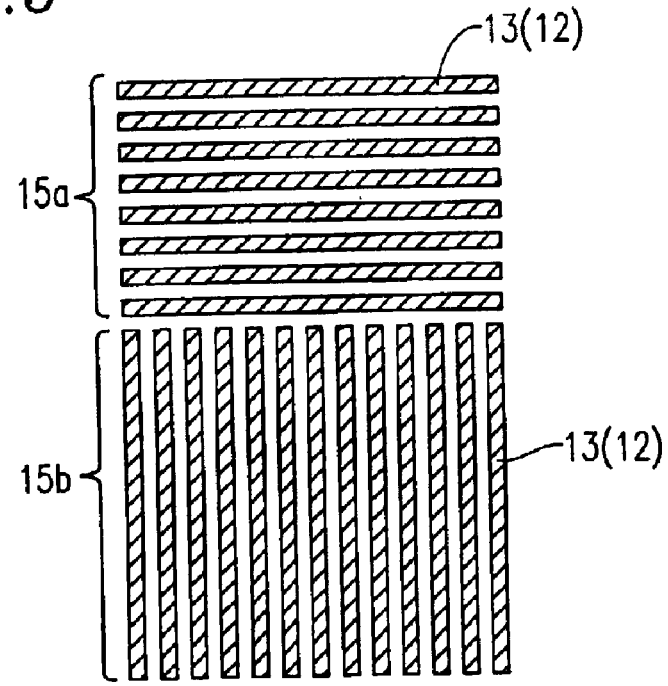
FIG.6
(a)
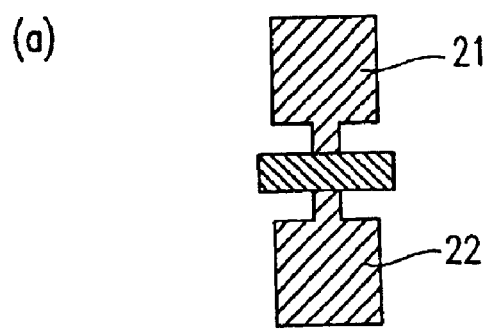
(b)
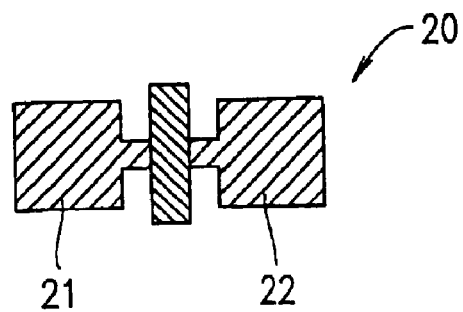

FIG.7
(a)
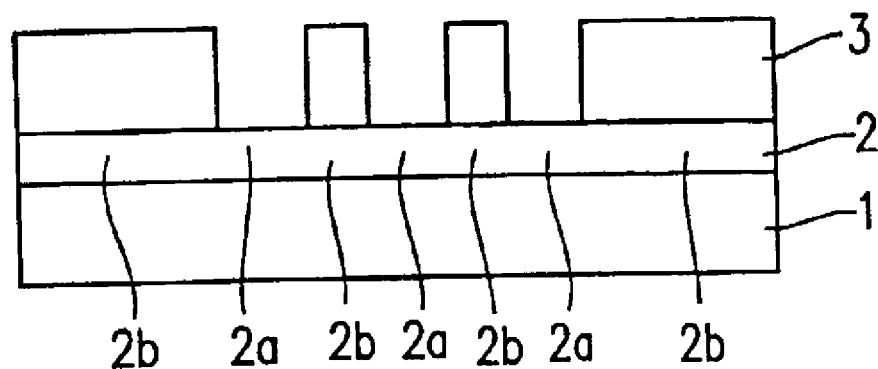
(b)
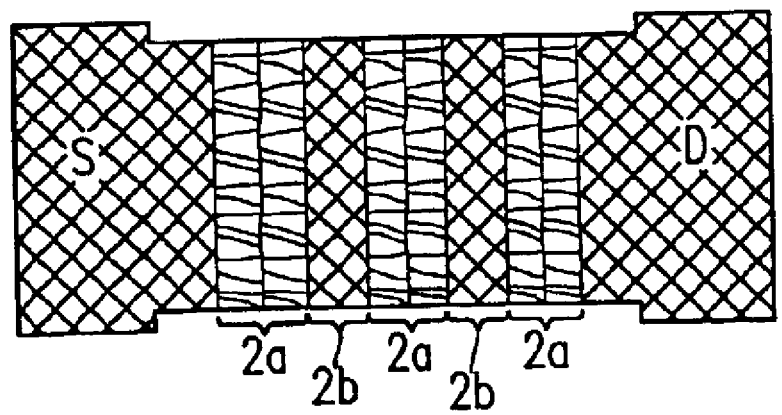
PRIOR ART

First regions
(there were stripes of films 25 and 26)

First regions
(there were stripes of films 25 and 26)

FIG.14    Comparison of reflectance    SiO$_2$ n=1.462

Relationship between reflectance and thickness of silicon oxide film for:
- Nd : YAG laser (wavelength : 532nm);
- XeCl excimer laser (wavelength : 308nm); and
- KrF excimer laser (wavelength : 248nm).

32a 32b 32a 32b 32a 32b 32a 32b 32a 32a 32b 32a 32b 32a 32b 32a 32b 32a

CRYSTALLINE SEMICONDUCTOR FILM AND PRODUCTION METHOD THEREOF, AND SEMICONDUCTOR DEVICE AND PRODUCTION METHOD THEREOF

BACKGROUND OF THE INVENTION

1. Field of the Invention

The present invention relates to: a crystalline semiconductor film obtained by crystallizing an amorphous semiconductor film formed on an amorphous insulating substrate, and a method for producing such a crystalline semiconductor film; and a semiconductor device using such a semiconductor film and a method for producing the semiconductor device. More specifically, the present invention relates to: a crystalline semiconductor film obtained by crystallizing an amorphous semiconductor film formed on an amorphous insulating substrate by applying thermal energy, wherein the thermal energy is applied by irradiating the amorphous semiconductor film with laser light, and a method for producing such a crystalline semiconductor film; and a semiconductor device using such a semiconductor film and a method for producing the semiconductor device.

2. Description of the Related Art

In recent years, active matrix type liquid crystal display apparatuses have been receiving attention as being advantageous, i.e., they are thin, light-weight, and low power consumption displays. In the art of active matrix type liquid crystal display apparatuses having such advantages, for the purpose of fulfilling various demands, such as an increase in display size, an increase in display resolution, a reduction of production cost, etc., a technique for forming a thin film transistor (hereinafter, referred to as "TFT"), as a liquid crystal driving element, using a polycrystalline semiconductor thin film on a less-expensive, low-melting point glass substrate, has been greatly expected.

As a technique for forming a polycrystalline semiconductor thin film at a low temperature around 600° C., a solid phase growth method is known, wherein after an amorphous semiconductor film is formed on a low-melting point glass substrate, a thermal treatment is performed on the substrate at about 600° C. for several hours to several tens of hours, thereby crystallizing the amorphous semiconductor film.

There is an alternative method for producing a crystalline semiconductor film, wherein an amorphous semiconductor film formed on a low-melting point glass substrate is locally irradiated with laser light, or the like, so that the irradiated film melts due to thermal energy generated from the laser light and changes into a crystalline semiconductor film.

Techniques of crystallizing an amorphous semiconductor film by irradiating laser light or the like have been studied for about 30 years. Among these, the study of a method of irradiating an amorphous semiconductor film using laser light as an energy source was started since the 1980s for production of an SOI substrate. In the 1990s, this method was used during the course of development of a production method of a liquid crystal panel based on a low temperature polysilicon technique, and mass production of such liquid crystal panels. This method can be regarded as the most fruitful method. Especially when using a less expensive substrate which cannot withstand a high temperature process, such as a glass substrate, or the like, it is necessary to apply thermal energy within a very short time period. A thermal energy source usable for such a case is only a pulse oscillation laser.

A polycrystalline semiconductor thin film formed using the above described method is patterned into the shape of islands, which will be active layers of TFTs. After the surface treatment has been performed on the patterned film, a gate insulating film is formed on the film. A method for crystallizing an amorphous semiconductor thin film by irradiating laser light, or the like, requires a relatively short time for crystallization in comparison to a crystallization method using a heating treatment. Furthermore, a polycrystalline semiconductor film formed using this method has high electron mobility in comparison to a polycrystalline semiconductor film formed using a crystallization method which uses a heating treatment.

IEEE Electron Dev. Lett., EDL-7, 276, 1986 (Samejima, et al.; hereinafter, Document 1) discloses a method for crystallizing an amorphous silicon thin film formed on a glass substrate by irradiating the film with a high-output excimer laser. The method for crystallizing an amorphous silicon thin film disclosed in Document 1 was originally conceived by Samejima, et al. In Document 1, the energy density of laser light applied on the amorphous silicon thin film is set to a value such that an upper portion of the silicon thin film partially melts. After the initial study by Samejima, et al., the relationship between the energy density of applied laser light and the size of a crystal grain formed was specifically studied. From such studies, it was found that as the energy density of laser light increases, the size of a crystal grain increases.

Such an increase of crystal grain size is studied in detail in J. Appl. Phys. 82, 4086 (hereinafter, Document 2). Document 2 reports that when the depth to which an amorphous semiconductor film is melted by irradiation with laser light was almost equal to the thickness of the amorphous silicon thin film, i.e., almost reached the interface between the silicon thin film and an underlying substrate, a huge crystal grain having a diameter of about several microns is formed. This is because a crystal grain remaining at the interface between the silicon thin film and its underlying layer serves as a crystal nucleus when initiating crystal solidification, whereby a crystal grain having a large diameter can be grown.

However, in the crystallization method described in Document 2, if the energy density of laser light is high so as to exceed a value at which a melted silicon thin film almost reaches the interface with an underlying layer, so that the silicon thin film is totally melted to the underlying layer, a cooling step suddenly occurs and nuclei are generated randomly. In such a case, a crystal grain formed is very small, or the silicon thin film returns to an amorphous state. Thus, in an actual case, in consideration of a variation in power of laser light, the laser light is set so as to produce energy slightly smaller than an energy density that can totally melt the silicon thin film. Under such a laser light irradiation condition, the diameter of a resultant crystal grain is about several hundreds of nanometers. Currently, mass production based on a low temperature polysilicon production technique is carried out according to the laser light irradiation condition determined based on the study of Document 2. Typical carrier mobility in a TFT produced based on the technique disclosed in Document 2 is 150 $cm^2/Vs$ for an n-channel type TFT, and 80 $cm^2/Vs$ for a p-channel type TFT.

After a liquid crystal panel having a semiconductor device formed from a polysilicon semiconductor film crystallized by irradiation with pulsed laser light was realized, an increase of performance of the polysilicon semiconductor thin film so as to realize an active matrix TFT substrate on which circuit elements having various functions are integrated has been highly demanded.

However, in the above-described method for crystallizing a semiconductor thin film by irradiation with laser light, or the like, a crystal grain of a crystallized polycrystalline semiconductor thin film is susceptible to the irradiation energy density of laser light or the like, a beam profile, the state of irradiated film surface, etc., and accordingly, it is difficult to form crystal grains over a large area glass substrate so as to have a uniform diameter and crystal orientation. In the case where active layers of TFTs are formed of such a polycrystalline semiconductor thin film where the diameter of the crystal grains is not uniform, the carrier mobility is large in a TFT having an active layer including large crystal grains, and the carrier mobility is small in a TFT having an active layer including small crystal grains. As a result, among a large number of TFTs formed over a single substrate, their characteristics are largely varied. Furthermore, if the crystal orientation is different among crystal grains, the mobility of carriers at an interface portion between the crystal grains is largely decreased.

A study which addresses such a problem proposes a crystallization method wherein an amorphous silicon film is totally melted in a crystallization step using laser light irradiation, and the generation of random nuclei is suppressed in the crystallization step while lateral growth is suppressed, whereby TFT characteristics which are equivalent to those of a monocrystalline substrate.

There are various methods proposed at the stage of study only. These methods are based on a common basic idea that, in a silicon thin film, totally melted regions and partially melted regions are mixedly formed such that these regions are in contact with each other, and crystal nuclei present in the partially melted regions are utilized for initiating crystallization of the totally melted regions. In the description provided below, two methods will be described as examples of a method which can be employed at a practical level.

In a first method, which is described in Appl. Phys. Lett. 69(19), 4 Nov. 1996 (hereinafter, Document 3), some regions in a semiconductor film are irradiated with a laser beam having an extremely high aspect ratio such that the semiconductor film in the irradiated regions are totally melted. Then, lateral crystal growth from crystalline semiconductor components included in non-irradiated film regions, which are adjacent to the irradiated region, is induced. In this method, the laser light scans over the semiconductor film with an interval (i.e., a non-irradiated region between irradiated regions) substantially equal to a distance over which lateral growth can be obtained during a single melting process, whereby crystal grains are grown in one direction along the scanning direction of the laser light. J. Im, et al., named this crystallization method "SLS" (Sequential Lateral Solidification) after such a methodology.

In the case where the first method is employed, crystals having any crystal length can be formed over a film without leaving a gap therebetween.

In a second method, which is described in IEEE Electron Device Meeting, San Francisco (hereinafter, Document 4), an aluminum film is formed in a stripe pattern on an amorphous silicon thin film which serves as a beam reflecting film.

Part (a) of FIG. 7 is a cross-sectional view illustrating a crystal growth method described in Document 4. Part (b) of FIG. 7 is a plan view of a crystalline semiconductor film obtained by this crystal growth method.

In the structure shown in part (a) of FIG. 7, an amorphous silicon thin film 2 is formed on an insulative substrate 1, and a beam reflecting film 3 is provided on the amorphous silicon thin film 2 in a stripe pattern so as to partially cover the upper surface of the amorphous silicon thin film 2. According to the method of Document 4, when the entire structure of part (a) of FIG. 7 is irradiated with a laser beam from the upper side, the amorphous silicon thin film 2 in regions 2a, which are not covered with the beam reflecting film 3, is totally melted (totally melted portions) because the amorphous silicon thin film 2 in regions 2a is exposed to the laser light. In regions 2b covered with the beam reflecting film 3, the amorphous silicon thin film 2 is not melted (non-melted portions) because the laser light does not reach the amorphous silicon thin film 2 in regions 2b. The totally-melted portions and the non-melted portions occur in an alternate order without interruption therebetween (i.e., the totally-melted portions and the non-melted portions are in contact with each other) because the beam reflecting film 3 is provided in a stripe pattern. The melted silicon in the totally-melted portion 2a laterally grows into crystals on the basis of crystal nuclei present in the non-melted portions 2b. As a result, as shown in part (b) of FIG. 7, crystal growth occurs from an interface between the totally-melted portion 2a and the non-melted portion 2b toward a substantially central portion of the totally-melted portion 2a. At the substantially central portion of the totally-melted portion 2a, the crystal grains formed appear as though they are crushed against each other.

AM-LCD 2000 Digest, p. 281 (hereinafter, Document 5), describes a method where a beam reflecting film is not provided, but some portions of a silicon thin film are formed thicker than the other portions. In the method of Document 5, the thinner portions of the silicon thin film result in totally-melted portions, whereas the thicker portions result in partially-melted portions. The melted silicon in the totally-melted portions laterally grows into crystals on the basis of crystal nuclei present in the partially-melted portions.

Japanese Laid-Open Publication No. 2000-260709 (hereinafter, Document 6) describes providing an antireflection film on a semiconductor film, in place of the beam reflecting film on the semiconductor film as in Document 4. In this method, by laser irradiation, regions of the semiconductor film which are covered with the antireflection film result in totally-melted portions, whereas regions which are not covered with the antireflection film result in partially-melted portions. The melted silicon in the totally-melted portions laterally grows into crystals on the basis of crystal nuclei present in the partially-melted portions.

In the above second methods described in Documents 4–6, a reflection (or antireflection) film is patterned on a silicon thin film so as to have a desired pattern, or some portions of the silicon thin film are formed thicker than the other portions according to a desired pattern, whereby the direction in which growth of crystal grains advances ("crystal growth direction") is determined regardless of the scanning direction of a laser beam. These methods are advantageous in that silicon films having crystal growth directions perpendicular to each other can be formed mixedly on the same substrate.

However, the above first and second methods have the following problems.

In the first method, the length of lateral crystal growth achieved by a single irradiation with laser light is very small, about 0.5 μm to about 4 μm. Because of this lateral crystal growth length, it is necessary to move the laser light so as to scan a semiconductor film with high precision corresponding to the lateral crystal growth length. As a result, processing time for crystallization becomes long. Further, it is necessary to prepare an apparatus having a special structure for providing the laser light in such a precise manner. Furthermore, in the first method, extremely elongated crystal grains extending along the scanning direction of laser light are formed. In the case where a TFT is formed from a crystalline silicon film having such crystal grains, the carrier mobility is extremely high if the direction in which carriers flow is the same as the direction in which the crystal grains extend. However, it is known that, if the direction in which carriers flow is perpendicular to the direction in which the crystal grains extend, the carrier mobility is about ⅓ of that achieved when the direction in which carriers flow is the same as the direction in which the crystal grains extend. In this method, since the direction in which crystal grains extend is determined based on the scanning direction of a laser beam, a high characteristic can be obtained only in one direction. Crystal grains extending different directions cannot be formed mixedly on the same substrate. Thus, this method imposes an undesired restriction on the design of a circuit device.

The second method has a problem that the length of crystal grains is limited by a lateral growth distance achieved by a single laser irradiation. Further, in this crystallization method, it is necessary to form non-melted or partially-melted portions at a predetermined interval so as to be adjacent to melted portions, because crystal growth in the melted portions is initiated by crystal nuclei present in the non-melted or partially-melted portions. However, if a non-melted (or partially-melted) portion formed is too small (narrow) in an attempt to place a laterally-grown crystal grain in a totally-melted portion as close as possible to a crystal grain in an adjacent totally-melted portion which is neighboring via the narrow non-melted portion, an initial nucleus in the non-melted portion, which is used for initiating crystal growth in the totally-melted portions, disappears due to laser light irradiation, and very small crystal nuclei may be formed due to random generation of nuclei. Thus, a non-melted portion has to be formed so as to have a certain size in order to avoid the above problem. Thus, in this crystallization method, the device size may increase because of an area which is required for forming non-melted or partially-melted portions.

SUMMARY OF THE INVENTION

According to one aspect of the present invention, there is provided a crystalline semiconductor film, the crystalline semiconductor film being formed over an insulative substrate, and including semiconductor crystal grains laterally grown along a surface of the insulative substrate, wherein the laterally-grown semiconductor crystal grains are in contact with each other at grain boundaries, and a distance between adjacent grain boundaries is equal to or smaller than two times a lateral growth distance of the semiconductor crystal grains.

In one embodiment of the present invention, the crystalline semiconductor film includes a plurality of regions such that growth directions of the laterally-grown semiconductor crystal grains in the regions are perpendicular to each other.

According to another aspect of the present invention, there is provided a crystalline semiconductor film, wherein a part of a grain boundary of laterally-grown semiconductor crystal grains is in contact with an amorphous semiconductor film.

According to still another aspect of the present invention, there is provided a method for producing a crystalline semiconductor film, comprising steps of: forming a semiconductor film on an insulative substrate; forming layered structures on the semiconductor film in a stripe pattern with a constant interval, the layered structures including an antireflection film for preventing reflection of laser light applied thereon, and a heating prevention film formed on the antireflection film for preventing heating caused by the applied laser light; applying laser light over the semiconductor film, on which the layered structures including the antireflection film and heating prevention film are provided, thereby crystallizing a portion of the semiconductor film on which the layered structure is not provided; removing the heating prevention film of each layered structure; and applying laser light over the semiconductor film, on which the striped antireflection film is provided, such that only the semiconductor film under the antireflection film is melted, whereby the semiconductor film under the antireflection film is crystallized.

In one embodiment of the present invention, the heating prevention film is a reflection film for laser light, made of aluminum, chromium, or tungsten.

In another embodiment of the present invention, the heating prevention film is a silicon nitride film having a predetermined thickness.

In still another embodiment of the present invention, the reflectance of the reflection film is 90% or more.

In still another embodiment of the present invention, the antireflection film is formed of a silicon oxide film or a silicon nitride film.

In still another embodiment of the present invention, the reflectance of the antireflection film for laser light is smaller than the reflectance of the laser light of the semiconductor film on which the antireflection film is not provided by 20% or more.

In still another embodiment of the present invention, the method for producing a crystalline semiconductor film further comprises a step of applying energy to the semiconductor film formed over the insulative substrate such that the semiconductor film is crystallized, prior to the step of applying laser light to the semiconductor film.

In still another embodiment of the present invention, the step of applying energy to the semiconductor film such that the semiconductor film is crystallized is performed prior to the step of forming the layered structure.

In still another embodiment of the present invention, the energy for crystallizing the semiconductor film is supplied by heating the semiconductor thin film in an electric furnace.

In still another embodiment of the present invention, the energy for crystallizing the semiconductor film is supplied by irradiation with laser light.

According to still another aspect of the present invention, a method for producing a crystalline semiconductor film, comprising steps of: forming a semiconductor film on an insulative substrate; forming a cap film on the semiconductor film in a stripe pattern so as to have a predetermined thickness; applying over the semiconductor film first laser light having a wavelength which allows the cap film to function as a heating prevention film, thereby crystallizing a portion of the semiconductor film on which the cap film is not provided; and applying over the semiconductor film second laser light having a wavelength which allows the cap film to function as an antireflection film, thereby crystallizing a portion of the semiconductor film on which the cap film is provided.

In one embodiment of the present invention, the wavelength of the first laser light is set such that a thermal energy which is caused by the irradiation with the first laser light and which reaches the portion of the semiconductor film on which the cap film is provided is smaller than a thermal energy which is caused by the irradiation with the first laser light and which reaches the portion of the semiconductor film on which the cap film is not provided; and the wavelength of the second laser light is set such that a thermal energy which is caused by the irradiation with the second laser light and which reaches the portion of the semiconductor film on which the cap film is provided is larger than a thermal energy which is caused by the irradiation with the second laser light and which reaches the portion of the semiconductor film on which the cap film is not provided.

In another embodiment of the present invention, the thickness of the cap film is set such that: the cap film functions as the heating prevention film when the first laser light is applied; and the cap film functions as the antireflection film when the second laser light is applied.

In still another embodiment of the present invention, the steps of applying the first and second laser light over the semiconductor film to crystallize the semiconductor film are performed sequentially as different process steps.

In still another embodiment of the present invention, the steps of applying the first and second laser light over the semiconductor film to crystallize the semiconductor film are concurrently performed in a single laser light scanning operation, using first and second laser light sources arranged in parallel such that the first and second laser light irradiate different regions over the semiconductor film.

In still another embodiment of the present invention, the first and second laser light are pulsed laser light; and the steps of applying the first and second laser light over the semiconductor film to crystallize the semiconductor film are concurrently realized in a single laser light scanning operation by alternately applying the first and second laser light over the semiconductor film from the same laser light irradiation position.

According to still another aspect of the present invention, there is provided a method for producing a crystalline semiconductor film by crystallizing a semiconductor film, comprising: a semiconductor film formation step of forming a semiconductor film over an insulative substrate; a heating/cooling suppression film formation step of forming a plurality of heating/cooling suppression films in a stripe pattern with a predetermined interval so as to have a same predetermined thickness; a first irradiation step of applying first laser light on the semiconductor film from a side where the heating/cooling suppression films are formed, such that a cap region semiconductor film covered with the heating/cooling suppression films and a bare region semiconductor film not covered with the heating/cooling suppression films are completely melted; a cap region crystallizing step of crystallizing the completely-melted cap region semiconductor film on the basis of the bare region semiconductor film; after the cap region crystallizing step, a second irradiation step of applying second laser light on the semiconductor film from a side where the heating/cooling suppression films are formed, such that only the bare region semiconductor film is completely melted; a bare region crystallizing step of crystallizing the completely-melted bare region semiconductor film on the basis of the cap region semiconductor film; and a removal step of removing the heating/cooling suppression films from the semiconductor film.

In one embodiment of the present invention, the predetermined thickness of each heating/cooling suppression film is such that an energy required for completely melting the cap region semiconductor film is greater than an energy required for completely melting the bare region semiconductor film; the first laser light has an energy greater than the energy for completely-melting the cap region; and the second laser light has an energy greater than the energy for completely-melting the bare region and smaller than the energy for completely-melting the cap region.

In another embodiment of the present invention, the thickness of the heating/cooling suppression film is set to be equal to or greater than $(3\lambda)/(8n)$, where $\lambda$ denotes the wavelength of the first and second laser light, and n denotes the refractive index of the heating/cooling suppression film.

In still another embodiment of the present invention, the heating/cooling suppression film is formed of a silicon oxide film.

In still another embodiment of the present invention, the heating/cooling suppression film is formed of any of a silicon oxide film or a layered film including a silicon oxide film and a silicon nitride film.

In still another embodiment of the present invention, in the cap region crystallizing step, the cap region semiconductor film is crystallized in such a manner that semiconductor crystal grains in the cap region semiconductor film laterally grow from longitudinal side faces of the cap region semiconductor film which are in contact with adjacent bare region semiconductor films toward a central portion of the cap region semiconductor film; and in the bare region crystallizing step, the bare region semiconductor film is crystallized in such a manner that semiconductor crystal grains in the bare region semiconductor film laterally grow from longitudinal side faces of the bare region semiconductor film which are in contact with adjacent cap region semiconductor films toward a central portion of the bare region semiconductor film.

According to still another aspect of the present invention, there is provided a crystalline semiconductor film produced using the crystalline semiconductor film production method of claim 20.

According to still another aspect of the present invention, there is provided a semiconductor device, comprising a crystalline semiconductor film formed over an insulative substrate as an active region of the semiconductor device, and the crystalline semiconductor film including semiconductor crystal grains laterally grown along a surface of the insulative substrate, wherein in the crystalline semiconductor film, the laterally-grown semiconductor crystal grains are in contact with each other at grain boundaries, and a distance between adjacent grain boundaries is equal to or smaller than two times a lateral growth distance of the semiconductor crystal grains.

In one embodiment of the present invention, the crystalline semiconductor film includes a plurality of regions such that growth directions of the laterally-grown semiconductor crystal grains in the regions are perpendicular to each other.

According to still another aspect of the present invention, there is provided a semiconductor device, comprising a crystalline semiconductor film formed over an amorphous insulative substrate as an active region of the semiconductor device, and the crystalline semiconductor film including semiconductor crystal grains laterally grown along a surface of the insulative substrate, wherein in the crystalline semiconductor film, a part of a grain boundary of the laterally-grown semiconductor crystal grains is in contact with an amorphous semiconductor film.

According to still another aspect of the present invention, there is provided a method for producing a semiconductor device including a crystalline semiconductor film on an insulative substrate as an active region of the semiconductor device, the crystalline semiconductor film being obtained by irradiating a semiconductor film with laser light a plurality of times so that semiconductor crystal grains laterally grow along a surface of the insulative substrate, the method comprising steps of: forming a semiconductor film over an insulative substrate; forming layered structures on the semiconductor film in a stripe pattern with a constant interval, the layered structures including an antireflection film for preventing reflection of the laser light applied thereon, and a heating prevention film formed on the antireflection film for preventing heating caused by the applied laser light; applying the laser light over the semiconductor film, on which the layered structures including the antireflection film and heating prevention film are provided, thereby crystallizing a portion of the semiconductor film on which the layered structure is not provided; removing the heating prevention film of each layered structure; and applying laser light over the semiconductor film, on which the striped antireflection film is provided, such that only the semiconductor film under the antireflection film is melted, whereby the semiconductor film under the antireflection film is crystallized.

According to still another aspect of the present invention, there is provided a method for producing a semiconductor device including a crystalline semiconductor film on an insulative substrate as an active region of the semiconductor device, the crystalline semiconductor film being obtained by irradiating a semiconductor film with laser light so that semiconductor crystal grains laterally grow along a surface of the insulative substrate, the method comprising steps of: forming the semiconductor film over the insulative substrate; forming a cap film on the semiconductor film in a stripe pattern so as to have a predetermined thickness; applying over the semiconductor film first laser light having a wavelength which allows the cap film to function as a heating prevention film, thereby crystallizing a portion of the semiconductor film on which the cap film is not provided; and applying over the semiconductor film second laser light having a wavelength which allows the cap film to function as an antireflection film, thereby crystallizing a portion of the semiconductor film on which the cap film is provided.

According to still another aspect of the present invention, there is provided a method for producing a semiconductor device including a crystalline semiconductor film as a channel region of the semiconductor device, the crystalline semiconductor film being obtained by crystallizing a semiconductor film, the method comprising: a semiconductor film formation step of forming a semiconductor film over an insulative substrate; a heating/cooling suppression film formation step of forming a plurality of heating/cooling suppression films in a stripe pattern with a predetermined interval so as to have a same predetermined thickness; a first irradiation step of applying first laser light on the semiconductor film from a side where the heating/cooling suppression films are formed, such that a cap region semiconductor film covered with the heating/cooling suppression films and a bare region semiconductor film not covered with the heating/cooling suppression films are completely melted; a cap region crystallizing step of crystallizing the completely-melted cap region semiconductor film on the basis of the bare region semiconductor film; after the cap region crystallizing step, a second irradiation step of applying second laser light on the semiconductor film from a side where the heating/cooling suppression films are formed, such that only the bare region semiconductor film is completely melted; a bare region crystallizing step of crystallizing the completely-melted bare region semiconductor film on the basis of the cap region semiconductor film; and a removal step of removing the heating/cooling suppression films from the semiconductor film.

According to still another aspect of the present invention, there, is provided a method for producing a semiconductor device including a crystalline semiconductor film as a channel region of the semiconductor device, the crystalline semiconductor film being obtained by crystallizing a semiconductor film, the method comprising: a semiconductor film formation step of forming a semiconductor film over an insulative substrate; a heating/cooling suppression film formation step of forming, in a first region on the semiconductor film, a plurality of first heating/cooling suppression films in a stripe pattern with a predetermined interval so as to have a same predetermined thickness, and forming, in a second region on the semiconductor film, a plurality of second heating/cooling suppression films in a stripe pattern with a predetermined interval so as to have a same predetermined thickness along a direction perpendicular to the longitudinal direction of the first heating/cooling suppression films; a first irradiation step of applying first laser light on the semiconductor film from a side where the heating/cooling suppression films are formed, such that a cap region semiconductor film covered with the first and second heating/cooling suppression films and a bare region semiconductor film not covered with the first or second heating/cooling suppression films are completely melted; a cap region crystallizing step of crystallizing the completely-melted cap region semiconductor film on the basis of the bare region semiconductor film; after the cap region crystallizing step, a second irradiation step of applying second laser light on the semiconductor film from a side where the first and second heating/cooling suppression films are formed, such that only the bare region semiconductor film is completely melted; a bare region crystallizing step of crystallizing the completely-melted bare region semiconductor film on the basis of the cap region semiconductor film; and a removal step of removing the first and second heating/cooling suppression films from the semiconductor film.

According to still another aspect of the present invention, there is provided a semiconductor device produced using the semiconductor device production method of claim 32.

According to still another aspect of the present invention, there is provided a semiconductor device produced using the semiconductor device production method of claim 33.

Thus, the invention described herein makes possible the advantages of (1) providing a crystalline semiconductor film and production method thereof, wherein crystal grains extending in different directions can be formed on the same substrate by a simple method without increasing the size of a device formed from such a film; and (2) providing a semiconductor device formed from such a film, and a method for producing the semiconductor device.

These and other advantages of the present invention will become apparent to those skilled in the art upon reading and understanding the following detailed description with reference to the accompanying figures.

BRIEF DESCRIPTION OF THE DRAWINGS

FIG. 5 shows two TFT regions provided on the same amorphous insulative substrate, wherein the stripe pattern in one TFT region is perpendicular to that in the other TFT region.

FIG. 6 shows TFTs corresponding to the TFT regions of FIG. 5.

Part (a) of FIG. 7 is a cross-sectional view illustrating a crystal growth method described in Document 4. Part (b) of FIG. 7 is a plan view of a crystalline semiconductor film obtained by this crystal growth method.

Figure 8A:
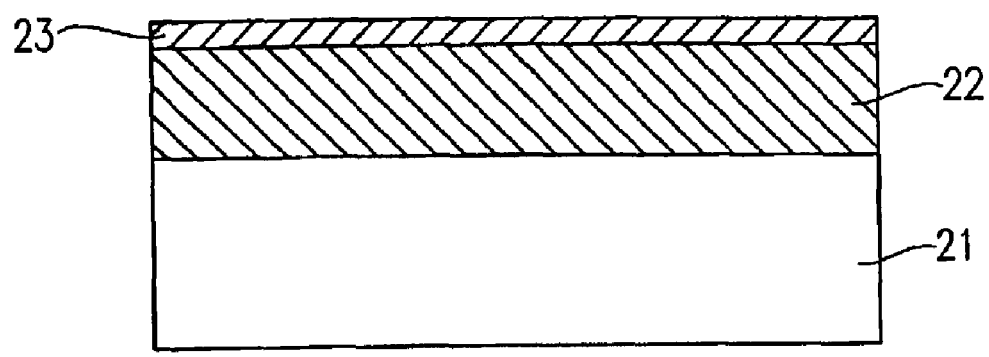
Figure 8B:
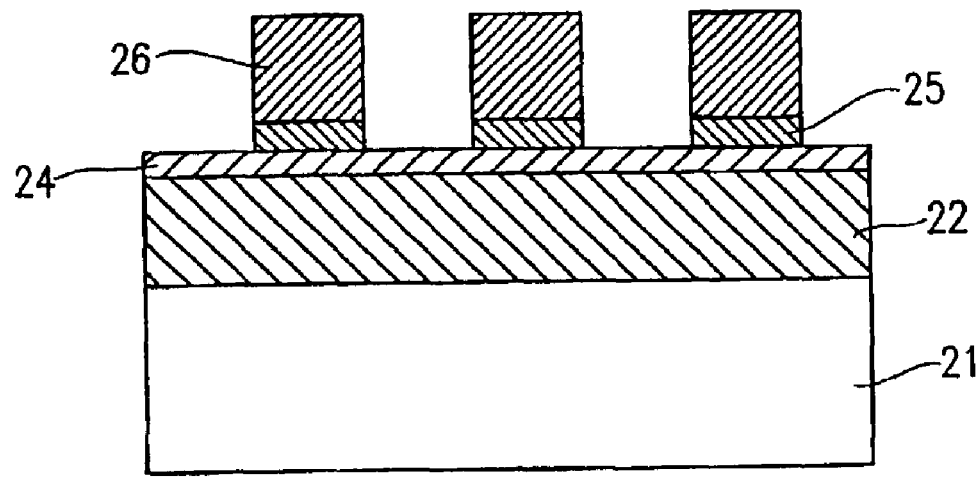

FIGS. 8(a) and 8(b) are cross-sectional views illustrating a method for producing a semiconductor film of Example 1 of embodiment 2 of the present invention.

Figure 9A:
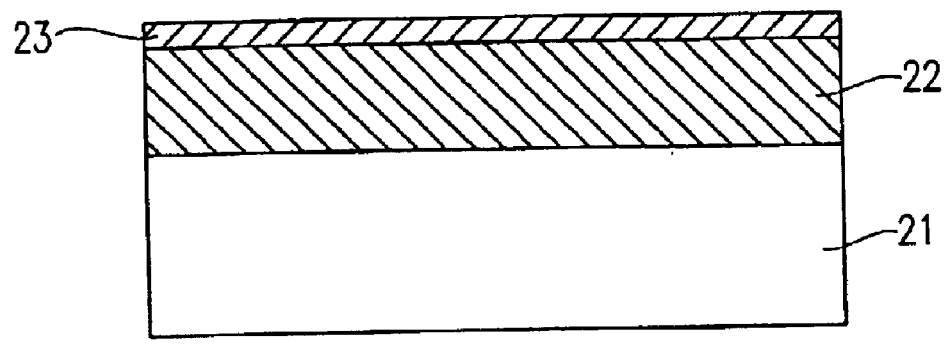
Figure 9B:
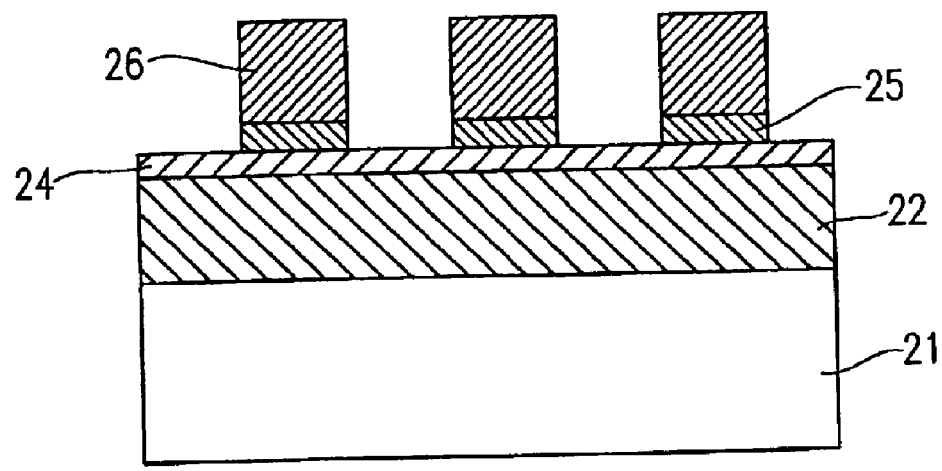

FIGS. 9(a) and 9(b) are cross-sectional views illustrating a method for producing a semiconductor film of Example 2 of embodiment 2 of the present invention.

Figure 10A:
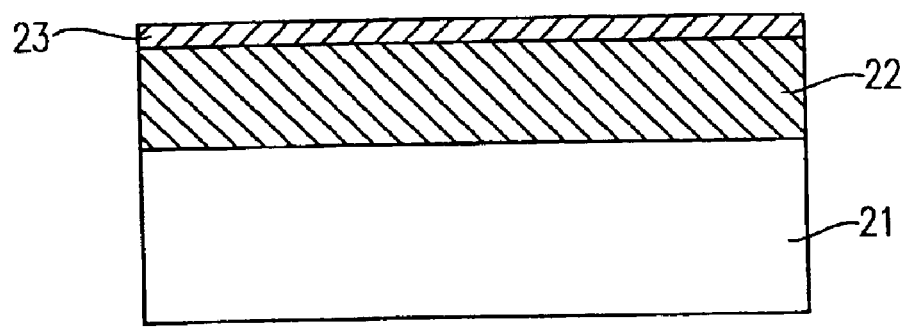
Figure 10B:
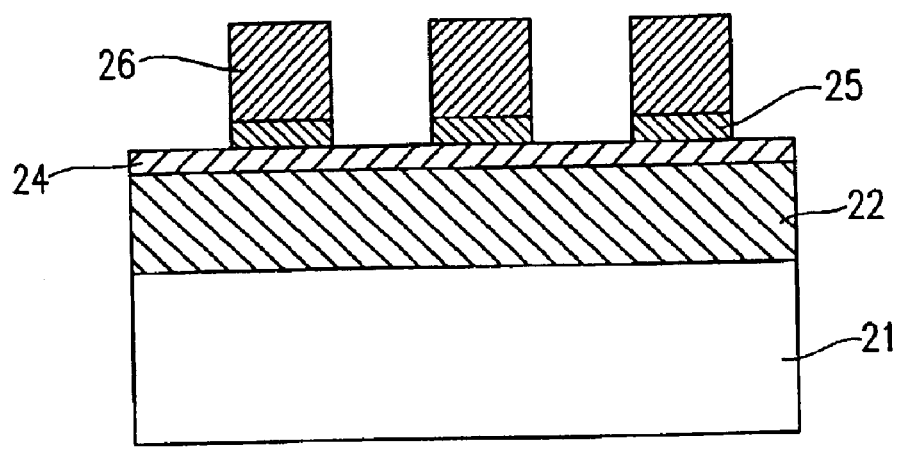

FIGS. 10(a) and 10(b) are cross-sectional views illustrating a method for producing a semiconductor film of Example 3 of embodiment 2 of the present invention.

Figure 11A:
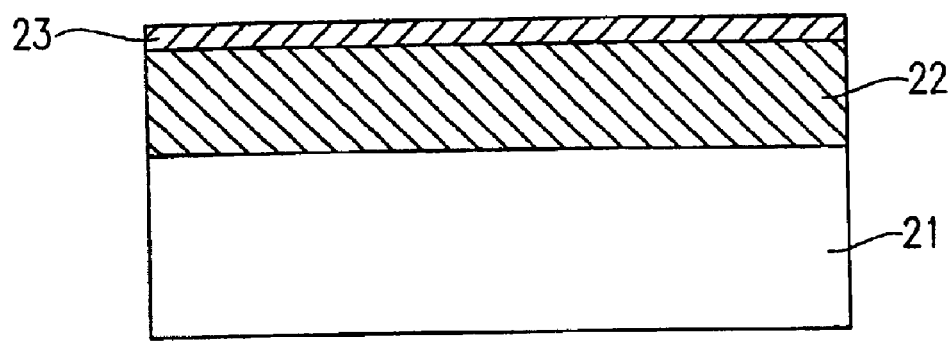
Figure 11B:
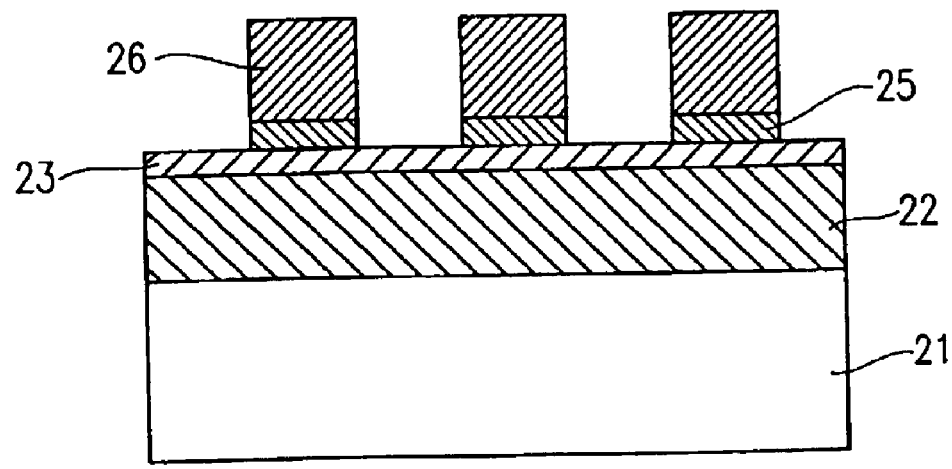

FIGS. 11(a) and 11(b) are cross-sectional views illustrating a method for producing a semiconductor film of Example 4 of embodiment 2 of the present invention.

Figure 12:
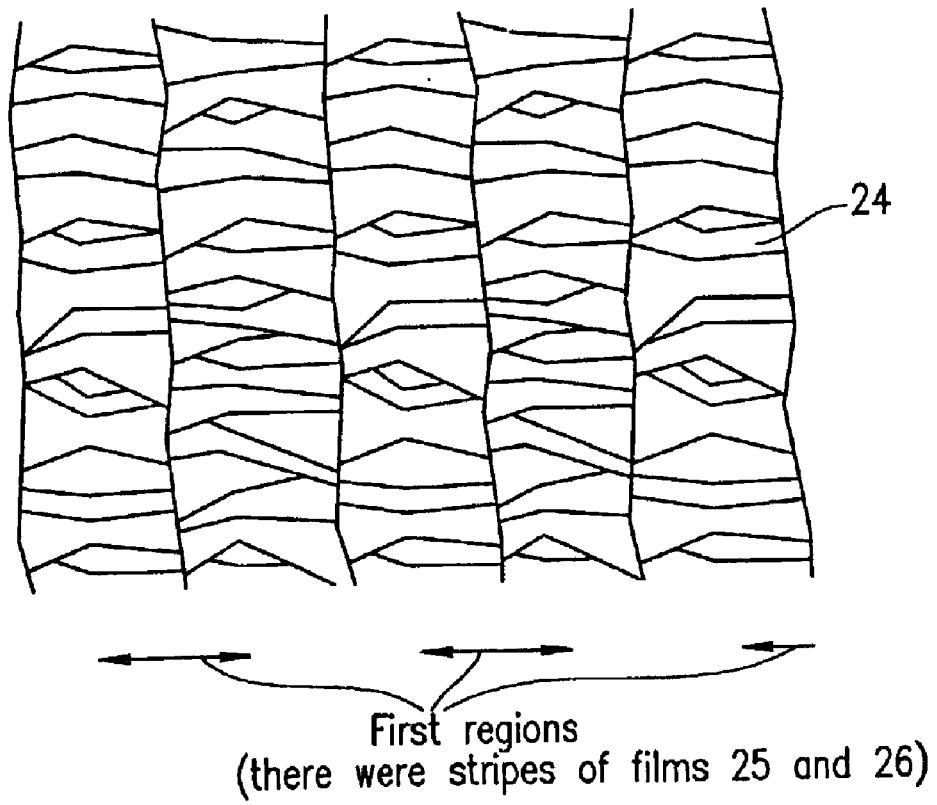

FIG. 12 is a plan view showing the crystalline state of a polycrystalline silicon film formed according to the method of Example 1, by observation with a scanning electron microscope (SEM).

Figure 13:
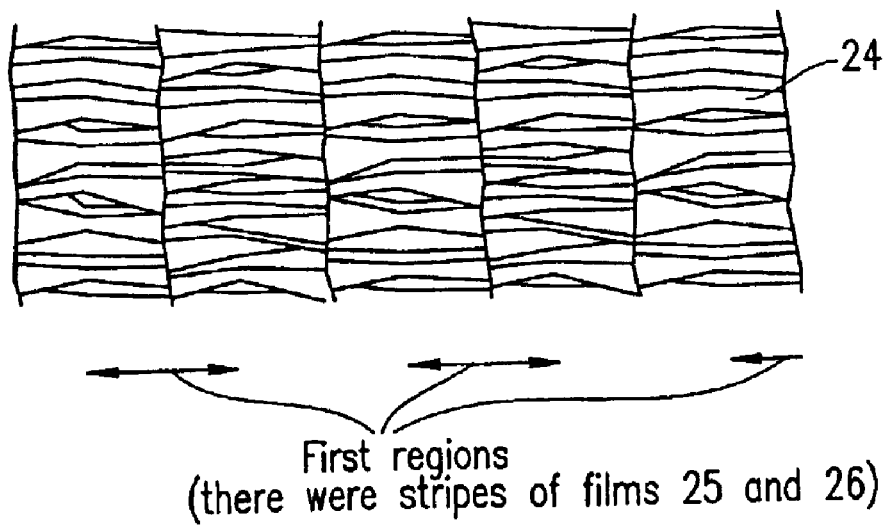

FIG. 13 is a plan view showing the crystalline state of a polycrystalline silicon film formed according to the method of Example 4, by observation with a scanning electron microscope (SEM).

Figure 14:
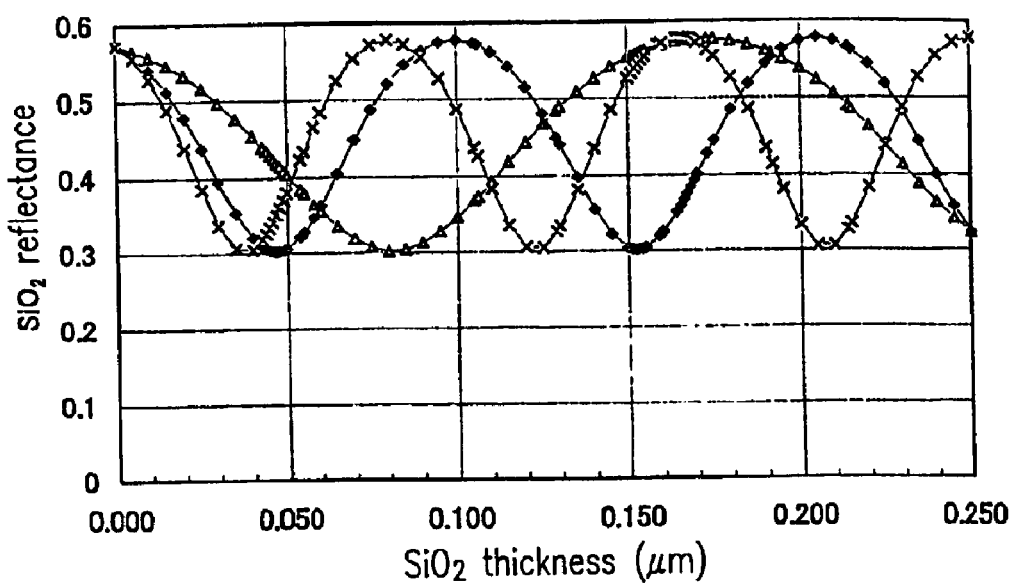

FIG. 14 is a graph showing the relationship between the thickness and the reflectance of a silicon oxide film formed on an amorphous silicon thin film for YAG laser light, XeCl excimer laser light, and KrF excimer laser light.

Figure 15:
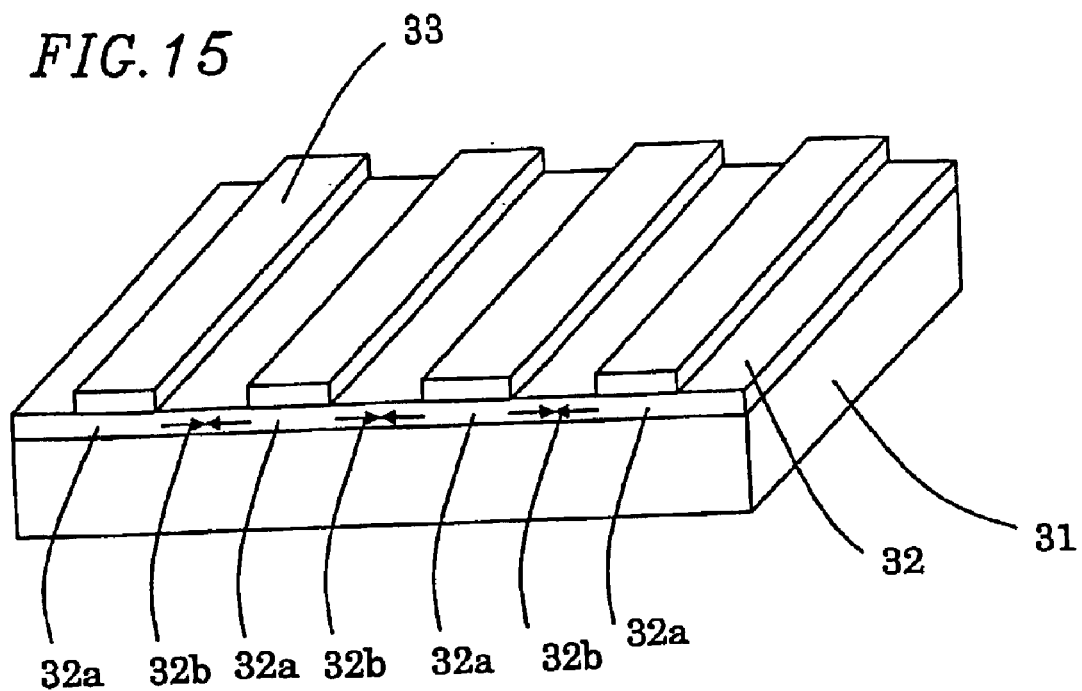

FIG. 15 is a perspective view illustrating the lateral crystal growth in an amorphous silicon thin film at a laser light irradiation step wherein a cap film formed on the amorphous silicon thin film functions as a heating prevention film.

Figure 16:
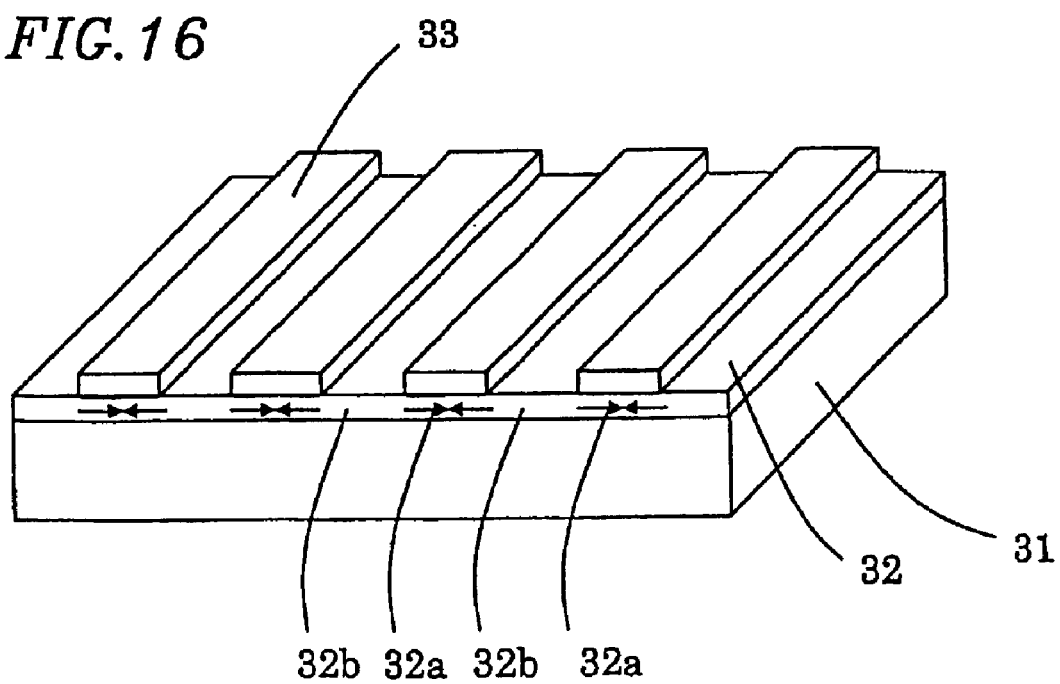

FIG. 16 is a perspective view illustrating the lateral crystal growth in an amorphous silicon thin film at a laser light irradiation step wherein a cap film formed on the amorphous silicon thin film functions as an antireflection film.

Figure 17:
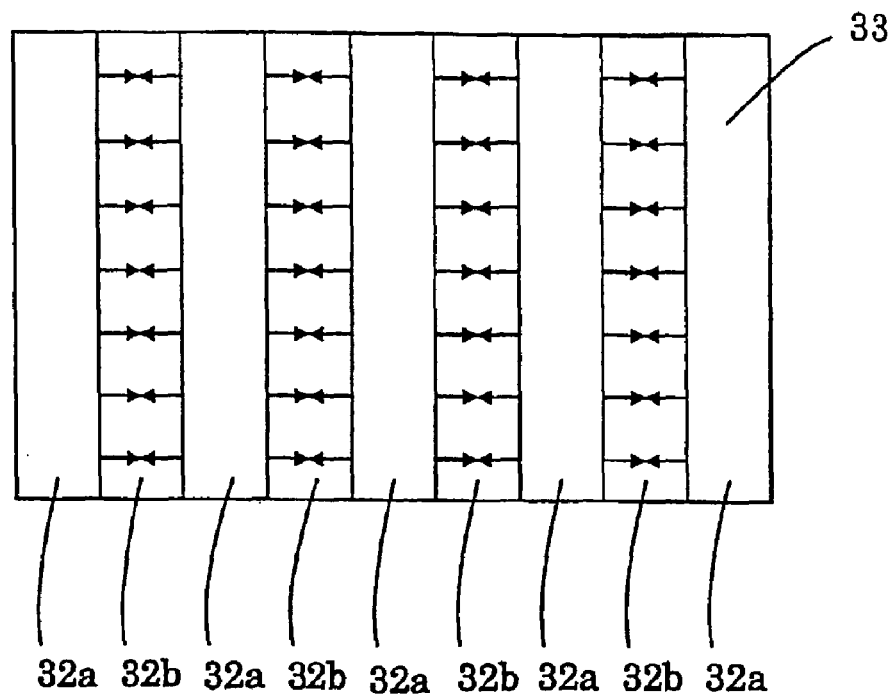

FIG. 17 is a plan view illustrating the crystallization in an amorphous silicon thin film at a laser light irradiation step wherein a cap film formed on the amorphous silicon thin film functions as a heating prevention film.

Figure 18:
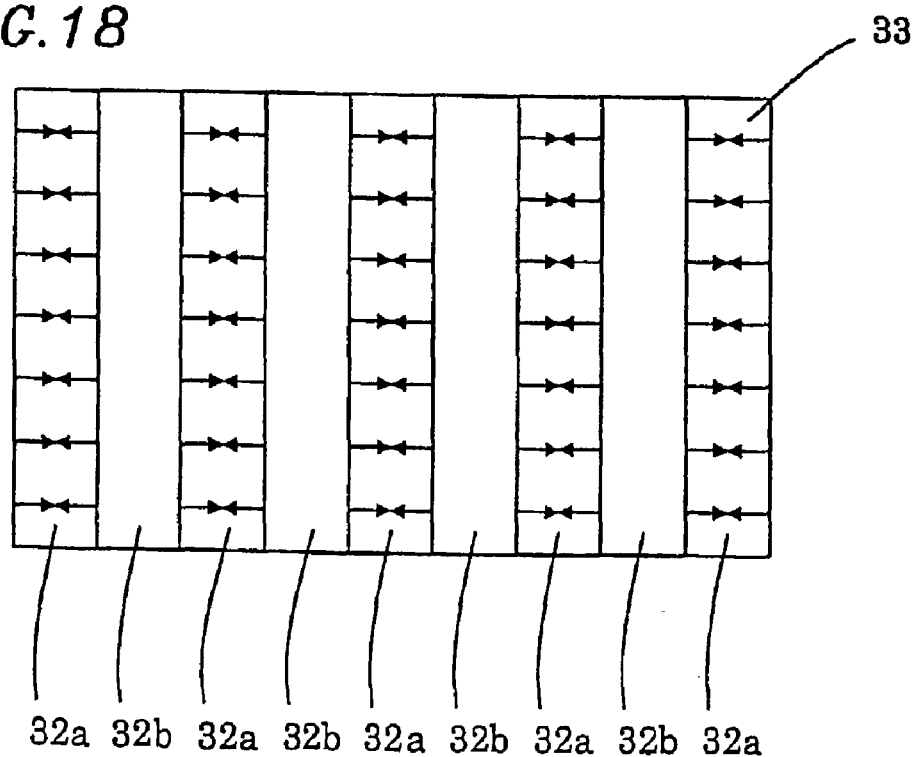

FIG. 18 is a plan view illustrating the crystallization in an amorphous silicon thin film at a laser light irradiation step wherein a cap film formed on the amorphous silicon thin film functions as an antireflection film.

Figure 19:
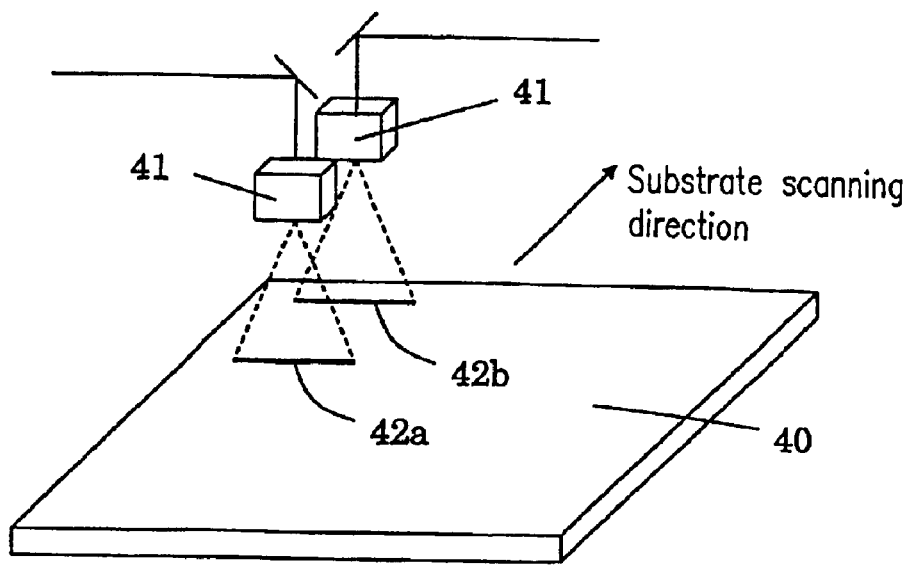

FIG. 19 illustrates a system for performing concurrent application of the two types of laser light beams of a second crystallization method.

Figure 20:
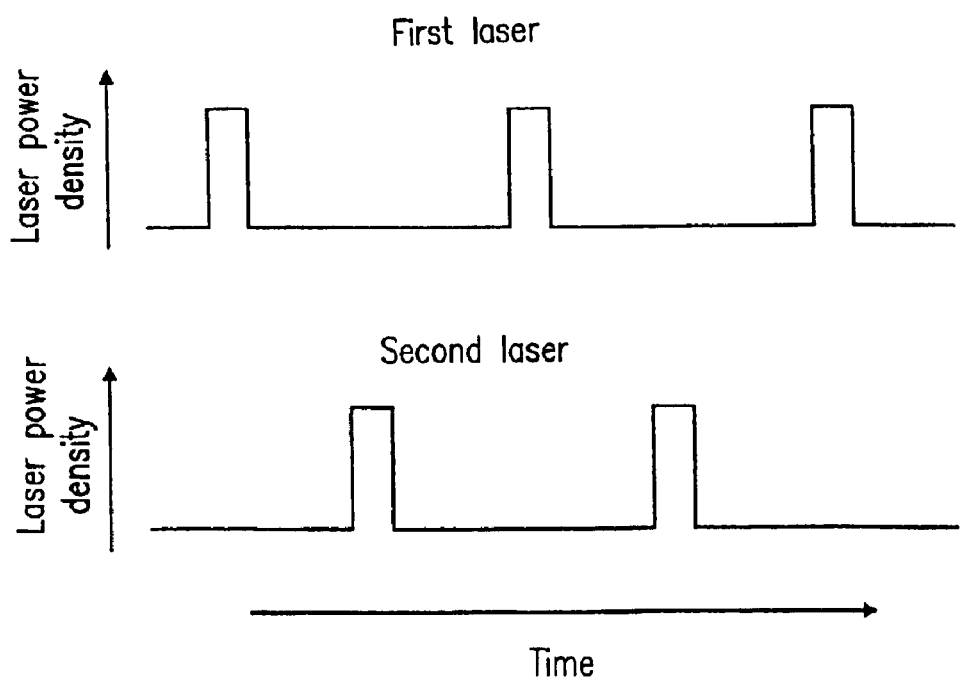

FIG. 20 is a timing chart illustrating alternate application of first and second pulsed laser light having different wavelengths.

Figure 21:
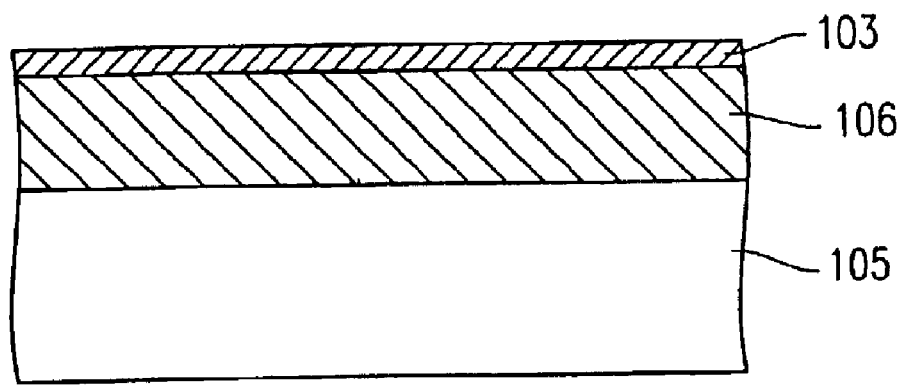

FIG. 21 is a cross-sectional view illustrating an amorphous silicon film formation step in a crystalline semiconductor film production method according to embodiment 4 of the present invention.

Figure 22:
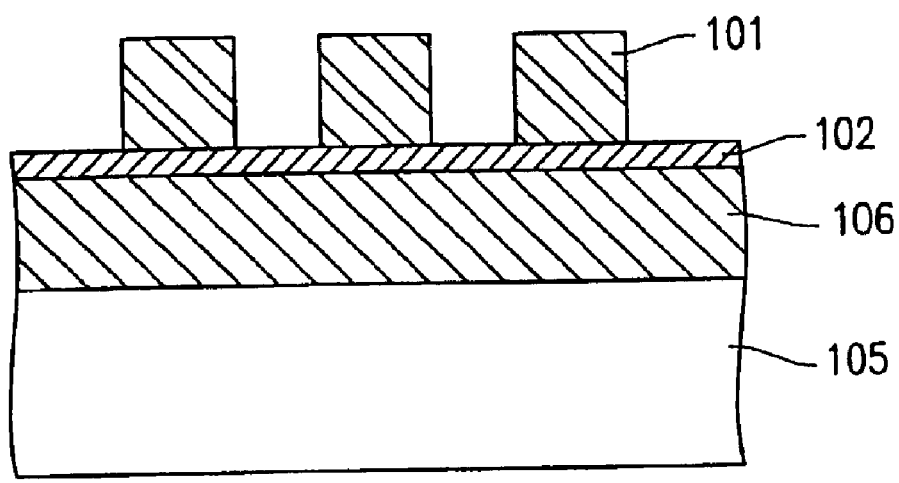

FIG. 22 is a cross-sectional view illustrating a heating/cooling suppression film formation step in the crystalline semiconductor film production method according to embodiment 4.

Figure 23:
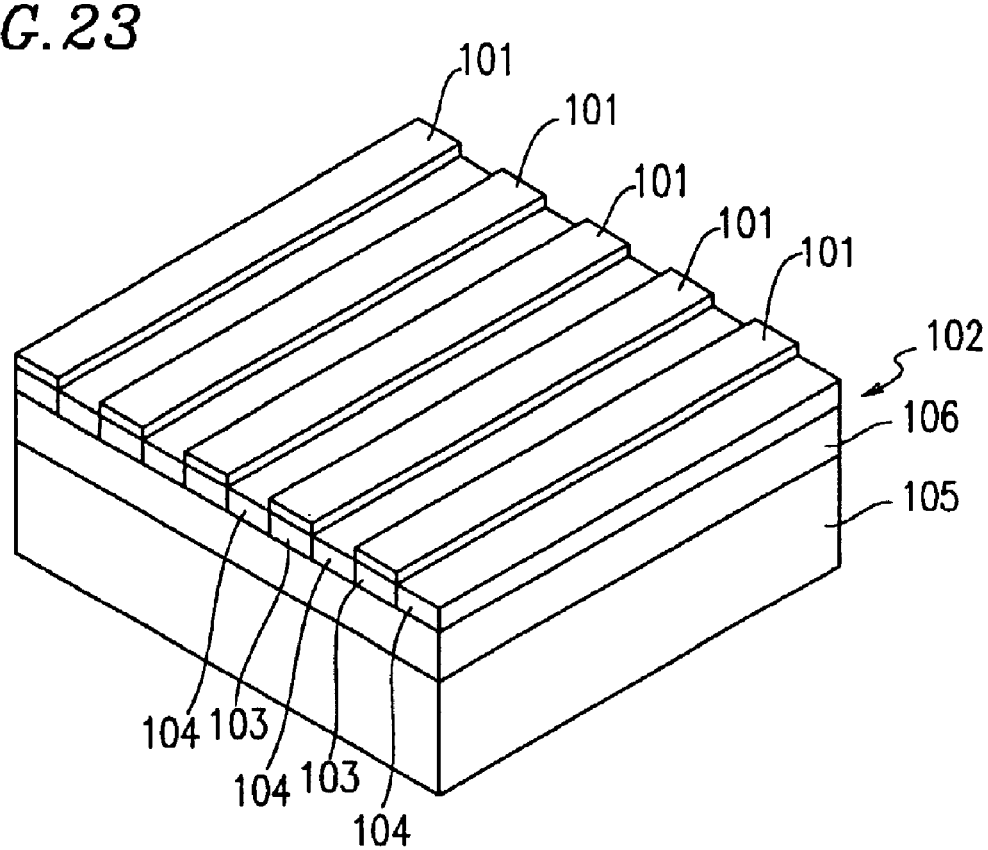

FIG. 23 is a perspective view illustrating a heating/cooling suppression film formation step in the crystalline semiconductor film production method according to embodiment 4.

Figure 24:
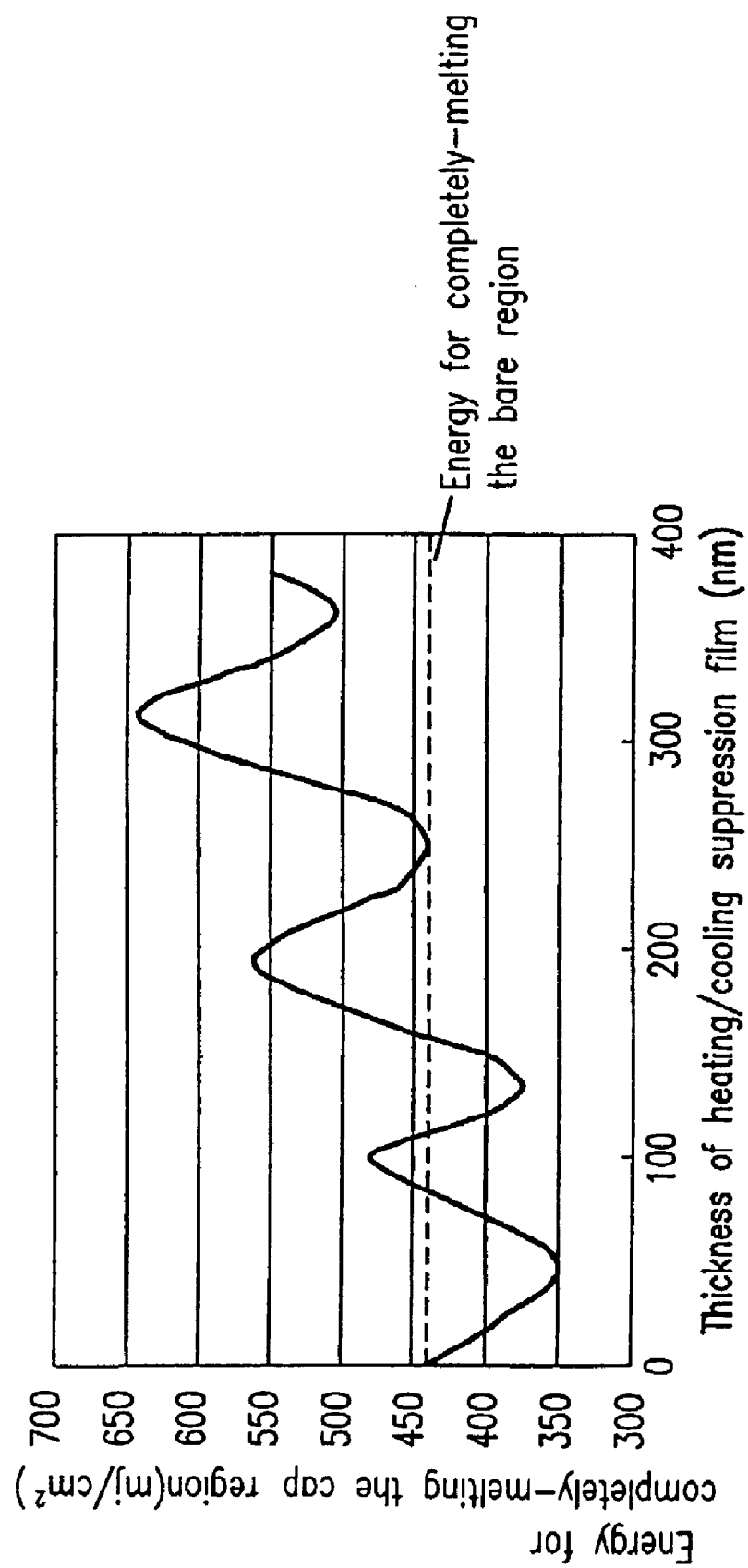

FIG. 24 is a graph showing the relationship between the thickness of a heating/cooling suppression film of embodiment 4 and the energy for completely-melting the cap region.

Figure 25:
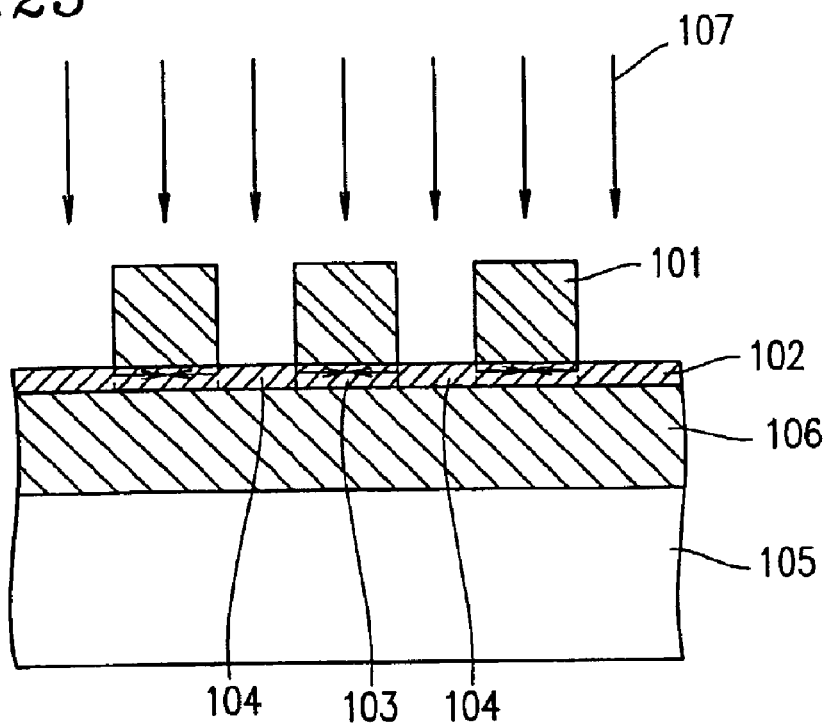

FIG. 25 is a cross-sectional view illustrating a first laser light irradiation step in a crystalline semiconductor film production method according to embodiment 4.

Figure 26:
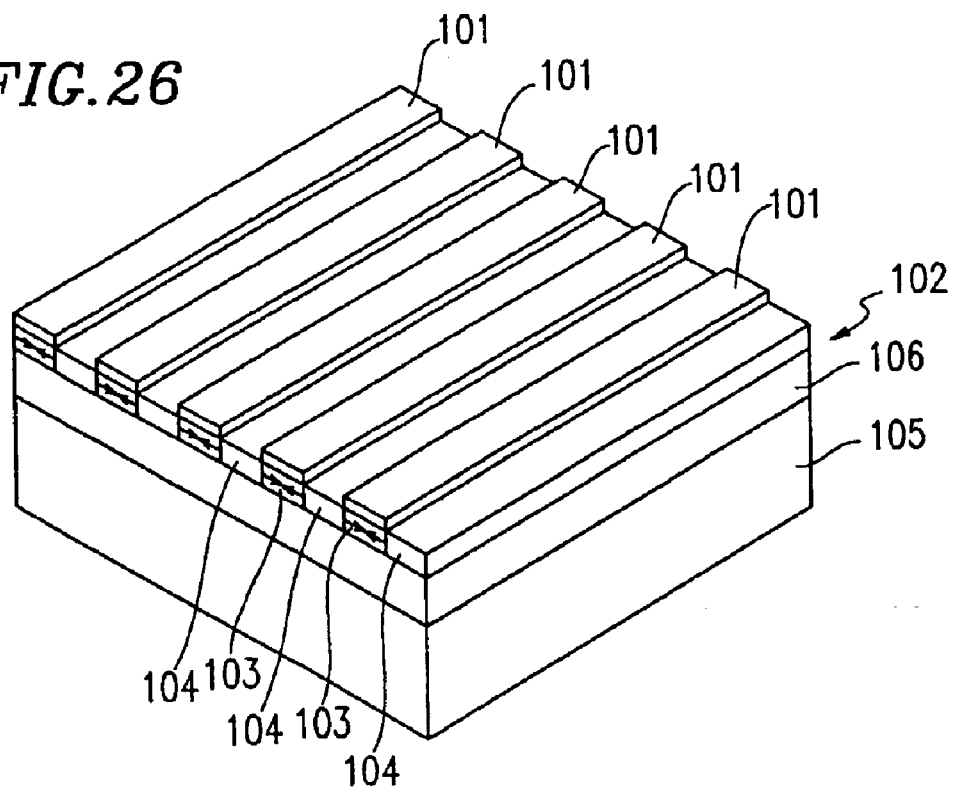

FIG. 26 is a perspective view illustrating a cap region crystallizing step in a crystalline semiconductor film production method according to embodiment 4.

Figure 27:
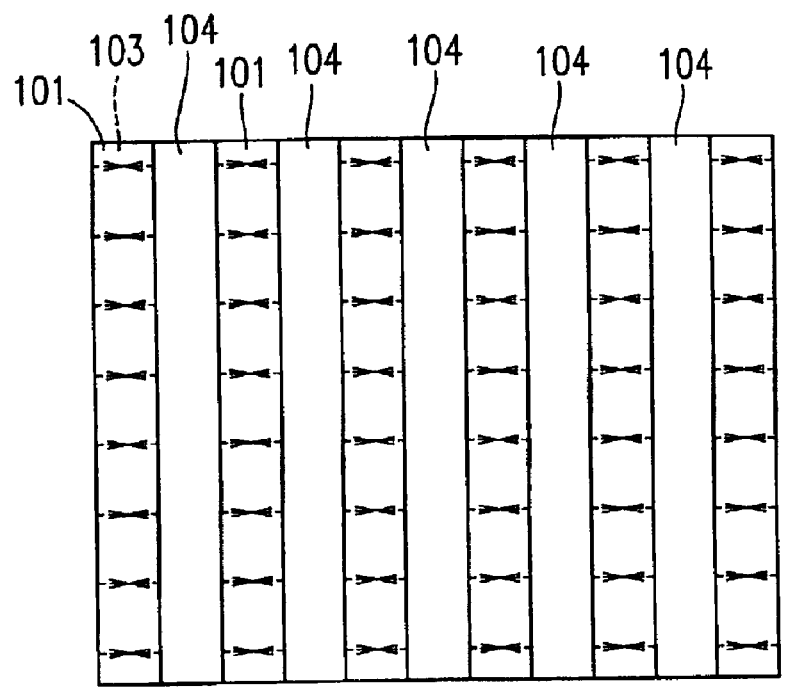

FIG. 27 is a plan view illustrating a cap region crystallizing step in a crystalline semiconductor film production method according to embodiment 4.

Figure 28:
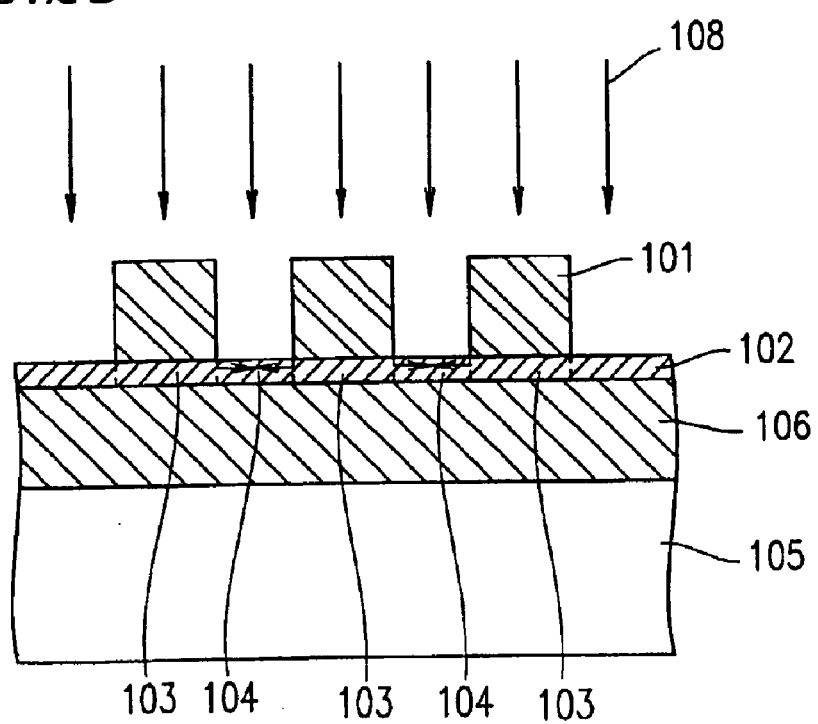

FIG. 28 is a cross-sectional view illustrating a second laser light irradiation step in a crystalline semiconductor film production method according to embodiment 4.

Figure 29:
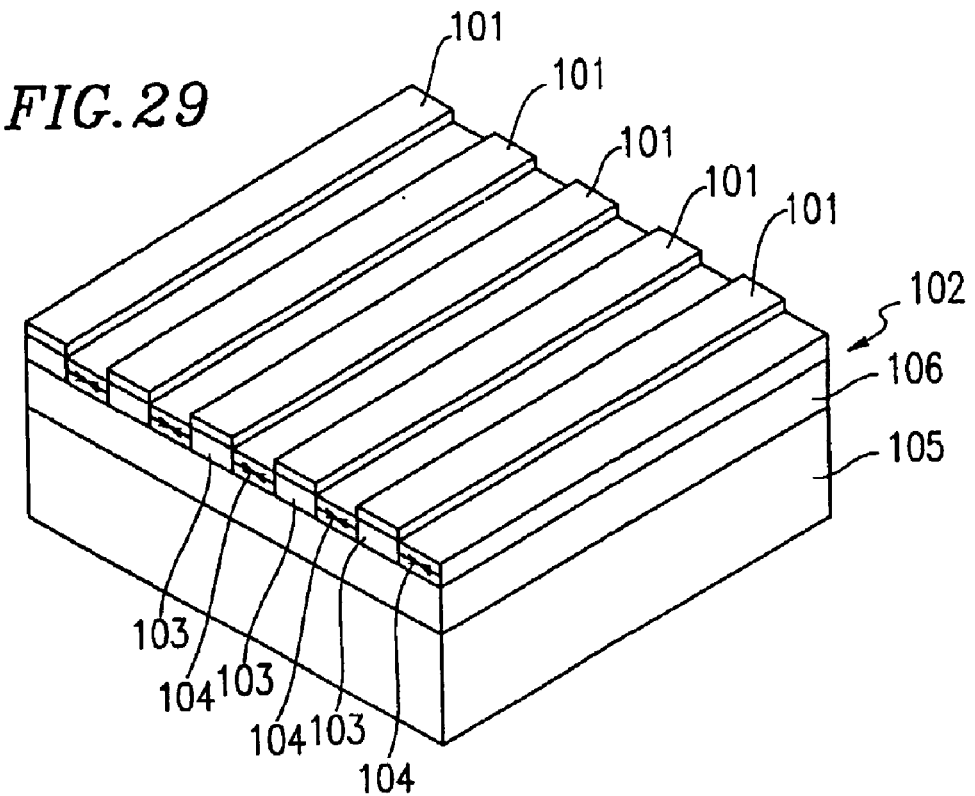

FIG. 29 is a perspective view illustrating a bare region crystallizing step in a crystalline semiconductor film production method according to embodiment 4.

Figure 30:
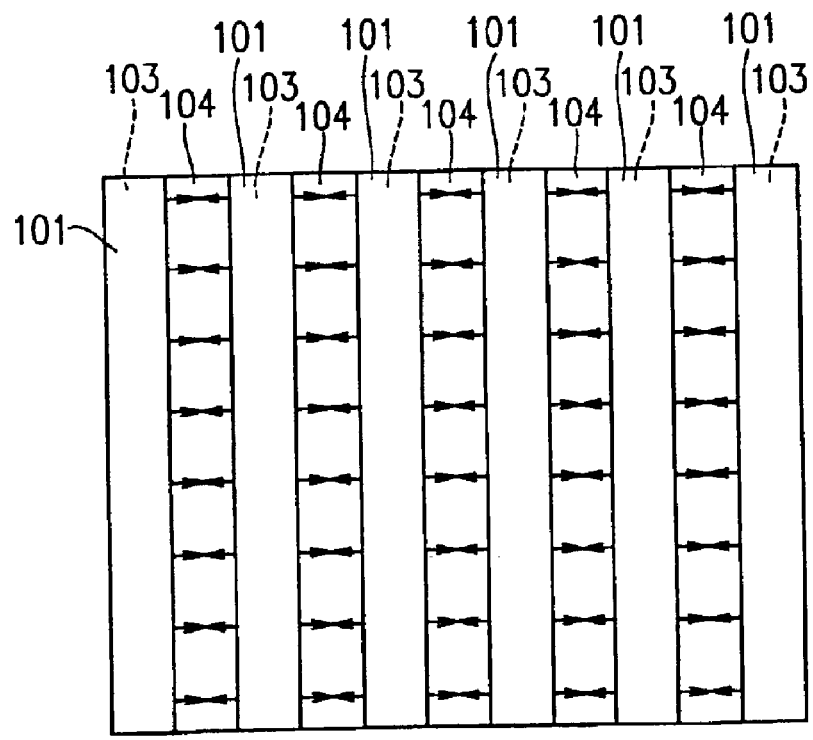

FIG. 30 is a plan view illustrating a bare region crystallizing step in a crystalline semiconductor film production method according to embodiment 4.

Figure 31:
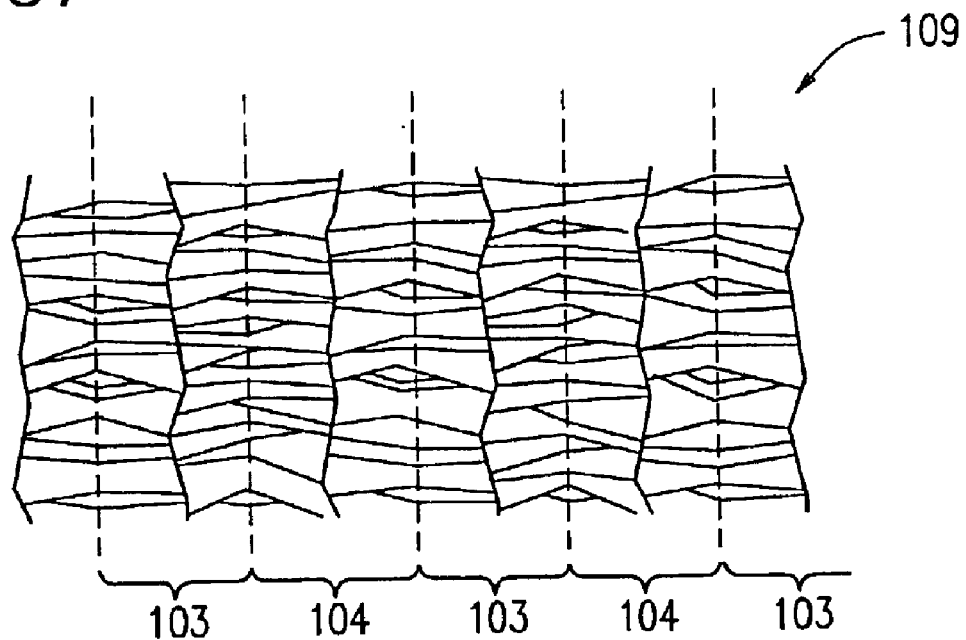

FIG. 31 is a plan view schematically showing a crystalline semiconductor film according to embodiment 4.

Figure 32:
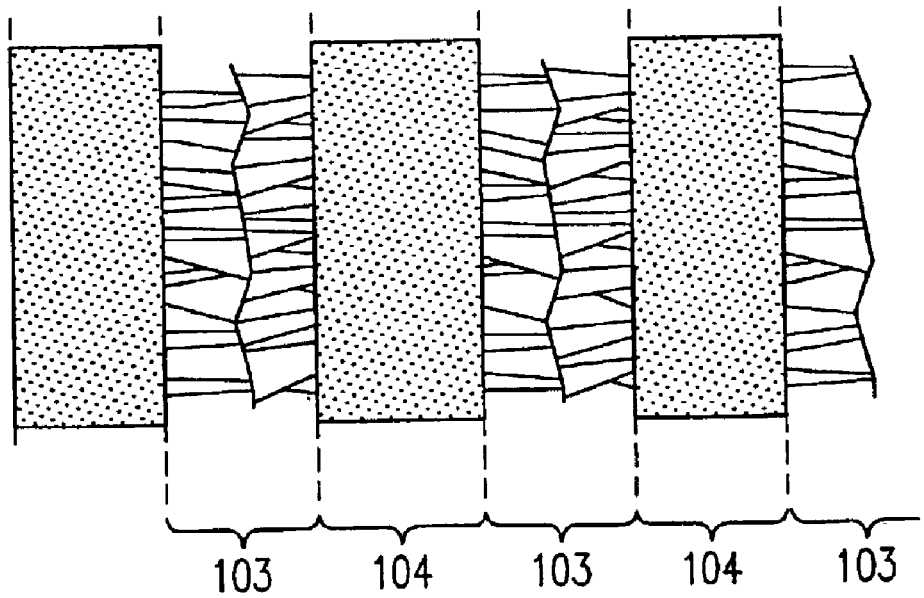

FIG. 32 is a plan view schematically showing a crystalline semiconductor film according to a comparative example.

Figure 33:
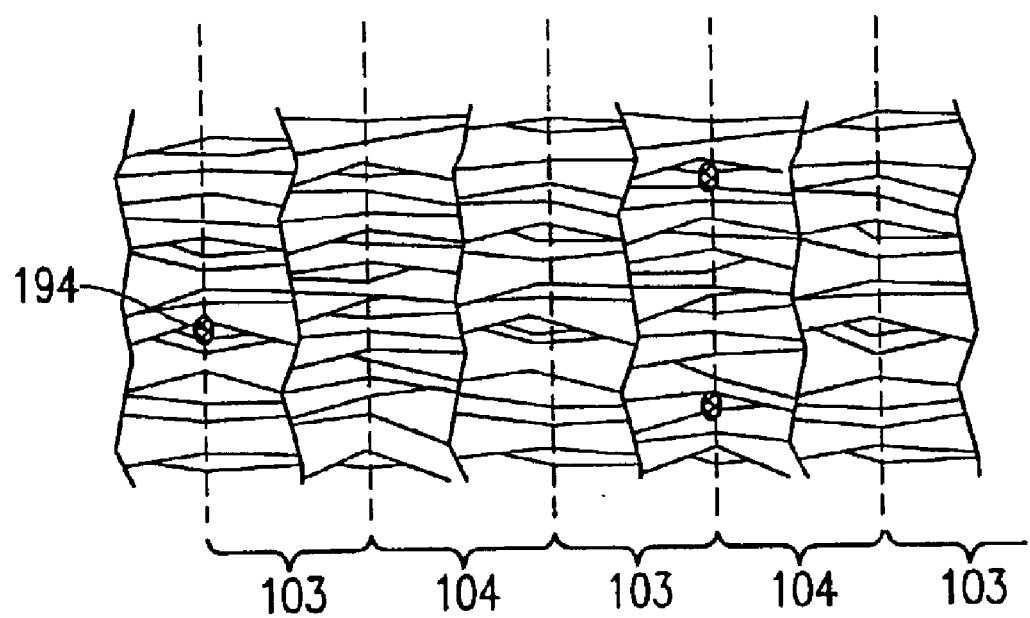

FIG. 33 is a plan view schematically showing a crystalline semiconductor film according to another comparative example.

Figure 34:
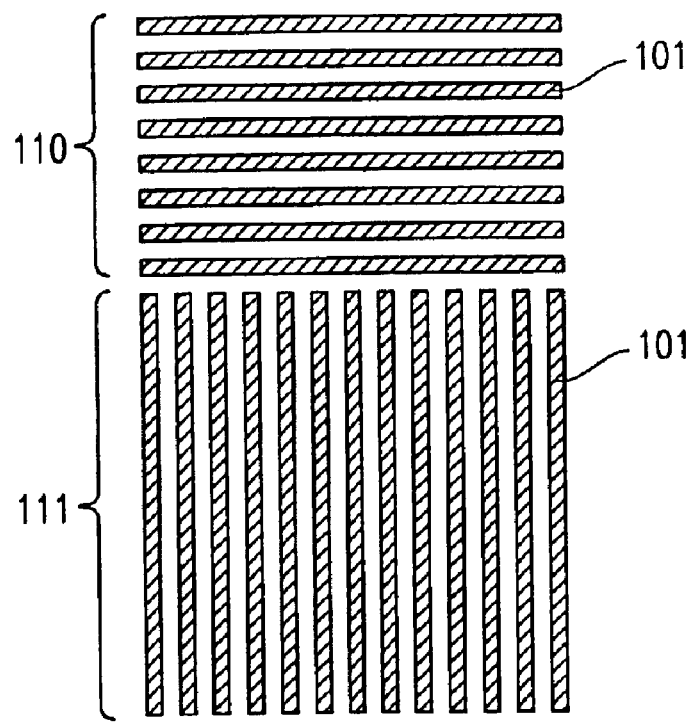

FIG. 34 is a plan view illustrating a production method of a thin film transistor of embodiment 5 of the present invention wherein a crystalline semiconductor film of embodiment 4 of the present invention is used in a channel region of the transistor.

Figure 35:
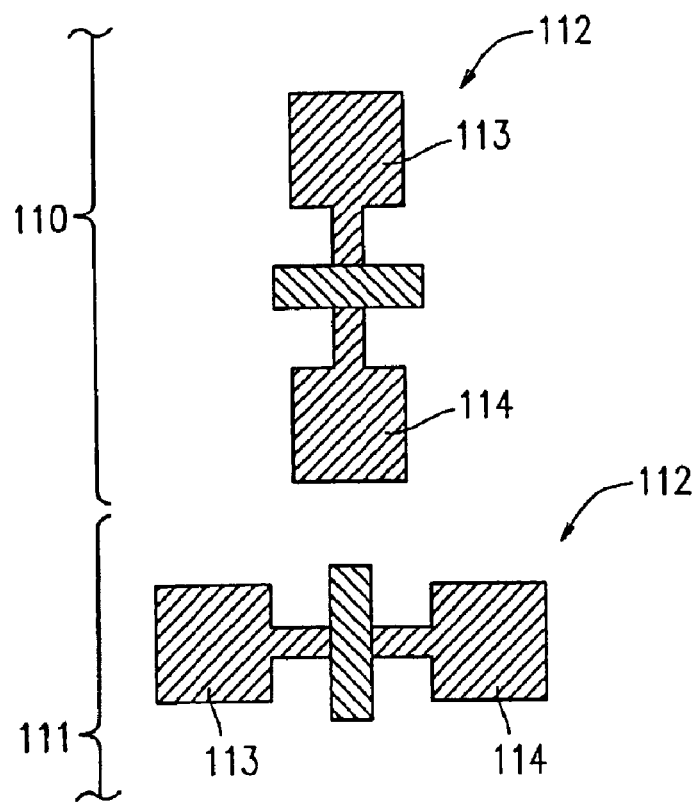

FIG. 35 is a plan view illustrating a production method of a thin film transistor of embodiment 5 of the present invention wherein a crystalline semiconductor film of embodiment 4 of the present invention is used in a channel region of the transistor.

DESCRIPTION OF THE PREFERRED EMBODIMENTS

Hereinafter, a crystalline semiconductor film and a production method thereof according to the present invention, and a semiconductor device and a production method thereof according to the present invention, will be described with reference to the drawings.

(Embodiment 1)

Figure 1:
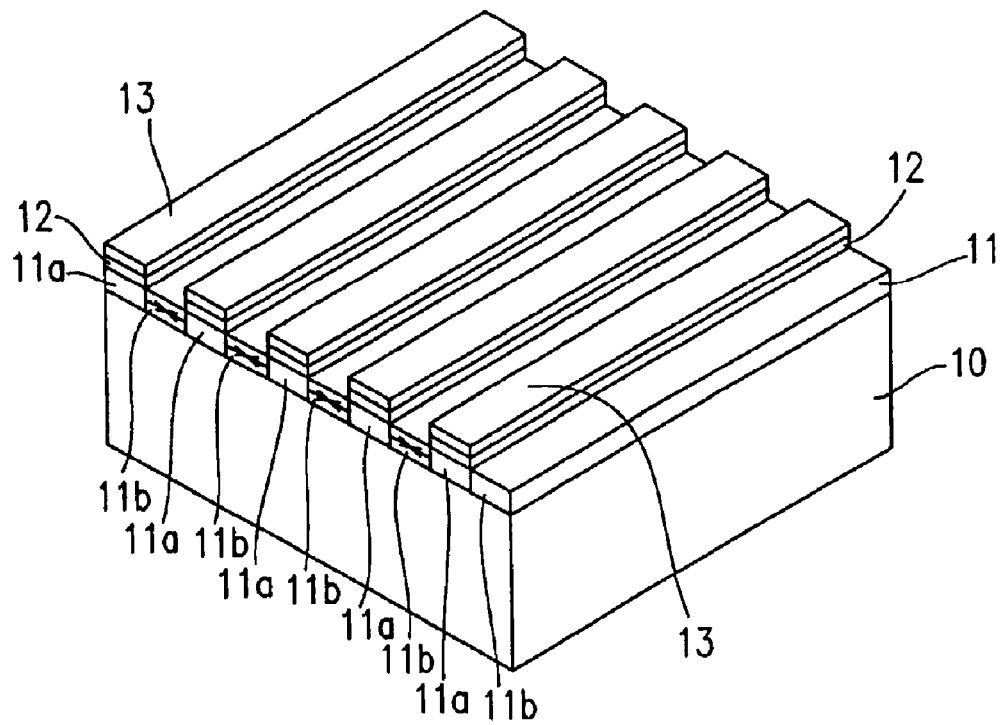
FIG. 1 shows an amorphous insulative substrate on which an amorphous silicon film, and antireflection and reflection films are formed prior to a first laser light irradiation step.

A crystalline semiconductor film according to embodiment 1 of the present invention is formed on an amorphous insulative substrate. FIG. 1 shows an amorphous insulative substrate 10 used for formation of a semiconductor film according to embodiment 1, and a structure formed thereon. Now, a general procedure of a method for forming a crystalline semiconductor film of embodiment 1 is described. In the first step, an amorphous silicon film 11 is formed over the entire surface of the amorphous insulative substrate 10. Over the amorphous silicon film 11, an antireflection film 12 is then formed in a stripe pattern with a predetermined interval. Over the antireflection film 12, a reflection film 13 for reflecting laser light, which functions as a heating prevention film, is formed from a reflective material (e.g., aluminum) in the same stripe pattern. As a result, over the amorphous silicon film 11, layered structures of the antireflection film 12 and the reflection film 13 are obtained in the stripe pattern with the predetermined interval. On the structure formed over the amorphous silicon film 11 having the above-described structure, a first laser light irradiation step is performed.

Regions 11a of the amorphous silicon film 11, over which the antireflection film 12 and the reflection film 13 are formed (referred to as "first region(s)"), are non-irradiated regions which are not irradiated with laser light in the first laser light irradiation step because of the uppermost reflection film 13. On the other hand, regions 11b of the amorphous silicon film 11, over which the antireflection film 12 and the reflection film 13 are not formed (referred to as "second region(s)"), are irradiated regions which are irradiated with laser light in the first laser light irradiation step because the regions 11b are exposed at the time of the first laser light irradiation step. Since the antireflection film 12 and the reflection film 13 are formed over the amorphous silicon film 11 in the stripe pattern with the predetermined pattern as shown in FIG. 1, the first regions 11a and the second regions 11b alternately occur at a predetermined frequency.

When the first laser light irradiation step is performed on the structure formed over the amorphous insulative substrate 10, the second regions 11b of the amorphous silicon film 11 is irradiated with laser light, so that crystal grains grow in the second regions 11b laterally from longitudinal side faces of the second regions 11b, i.e., from the interfaces between the first regions 11a and the second regions 11b, to the central portions of the second regions 11b along the direction shown by the arrows in FIG. 1. In each second region 11b of the amorphous silicon film 11, the crystal grains, which are growing laterally in the opposite directions indicated by the arrows in FIG. 1, meet with each other at substantially the lateral center of the second region 11b so that a grain boundary is formed substantially along the lateral center.

Next, the reflection film 13 in the uppermost layer is etched away.

Figure 2:
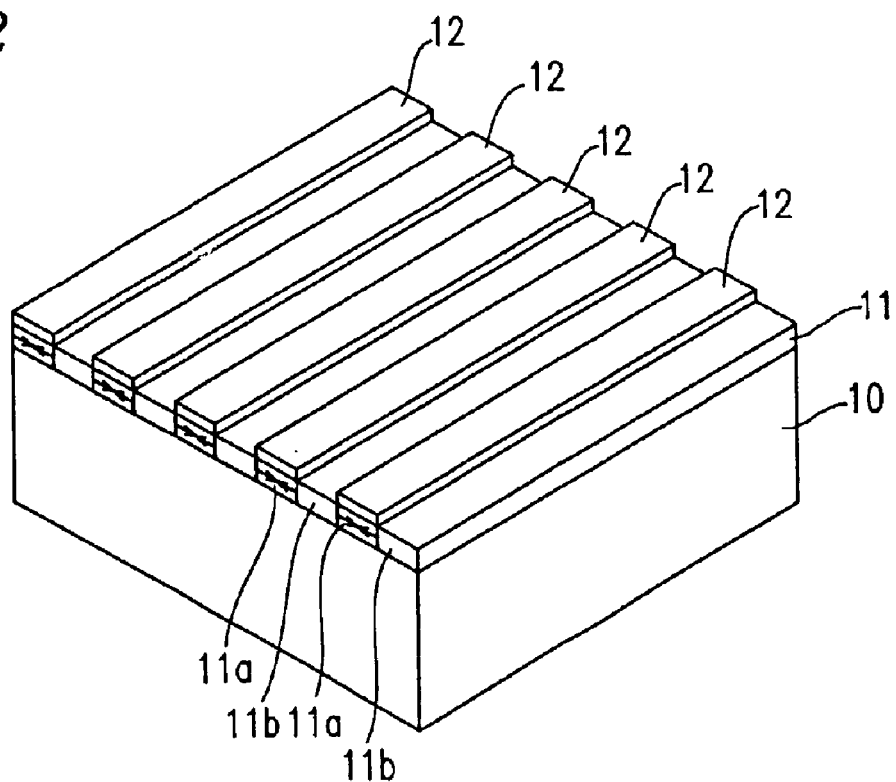
FIG. 2 shows the amorphous insulative substrate having the amorphous silicon film and the antireflection film just before a second laser light irradiation step.

FIG. 2 is a perspective view showing the resultant structure on the amorphous insulative substrate 10 obtained after the reflection film 13 has been removed. A second laser light irradiation step is performed on the structure of FIG. 2. In the second laser light irradiation step, the energy density of the applied laser light is adjusted to be lower than that of the laser light applied in the first laser light irradiation step, such that only silicon of the first regions 11a under the antireflection film 12 is completely melted while silicon of the second region 11b is not melted. As a result of the second irradiation step, in the first regions 11a of the amorphous silicon film 11, crystal grains of silicon laterally grow from longitudinal side faces of the first regions 11a, i.e., from the interfaces between the first regions 11a and the second regions 11b, to the central portions of the first regions 11a along the direction shown by the arrows in FIG. 2. In each first region 11a of the amorphous silicon film 11, the crystal grains, which are growing laterally in the opposite directions indicated by the arrows in FIG. 2, meet with each other at substantially the lateral center of the first region 11a so that a grain boundary is formed substantially along the lateral center. As a result, over the entire surface of the amorphous insulative substrate 10, a crystalline silicon film including laterally grown crystal grains which are arranged along the same direction can be obtained.

A method for producing a crystalline semiconductor film of embodiment 1 of the present invention is now specifically described in more detail. The crystalline semiconductor film of embodiment 1 is produced by performing the following steps (1) through (6).

(1) An amorphous silicon film 11 is formed over the entire surface of the amorphous insulative substrate 10. In the case where the thickness of the amorphous silicon film 11 is between 30 nm and 100 nm, a TFT can be preferably produced. In this embodiment, the amorphous silicon film 11 is formed so as to have a thickness of 45 nm.

(2) Next, an antireflection film 12 is then formed over the entire surface of the amorphous silicon film 11. The antireflection film 12 is provided for the purpose of preventing reflection of laser light applied in the second laser light irradiation step which is to be performed later. Then, a reflection film 13 is formed over the entire surface of the antireflection film 12. The reflection film 13 is provided for the purpose of reflecting laser light applied in the first laser light irradiation step which is to be performed later.

(3) Then, the antireflection film 12 and the reflection film 13, formed over the amorphous silicon film 11, are patterned into a stripe pattern with a predetermined interval.

Preferably, the antireflection film 12 is formed of a transparent insulative film which is commonly used for forming an oxide film, a nitride film, or the like, in the production of semiconductor devices. The thickness d of the antireflection film 12 is set so as to satisfy Expression (1) below:

$$d = \frac{\lambda}{4n}(2s+1), \qquad (1)$$

where d=thickness of antireflection film;
s=0, 1, 2, . . . ;
λ=wavelength; and
n=refractive index of antireflection film.

In the case where Expression (1) is satisfied, a phase difference of a half wavelength cycle of laser light is caused between a laser light beam incoming toward the antireflection film 12 and a laser light beam reflected from the antireflection film 12, so that the wavelengths of these laser light beams cancel each other. As a result, an antireflection function of the antireflection film 12 is further improved.

The reflectance of the antireflection film 12 is set such that, in the second laser light irradiation step, the difference between the thermal energy applied by the laser light to the first regions 11a of the silicon film 11 and the thermal energy applied by the laser light to the second regions 11b of the silicon film 11 is 20% or greater. For example, in the case where the reflectance of the silicon film 11 for laser light in the second regions 11b, over which the antireflection film 12 is not formed, is 60%, the reflectance of the antireflection film 12 for the laser light is set such that the reflectance of the silicon film 11 for the laser light in the first regions 11a, over which the antireflection film 12 is formed, is 40% or smaller. In this way, the reflectance of the antireflection film 12 for the laser light is set such that the thermal energy applied by irradiation with the laser light to the first regions 11a greatly differs from that applied to the second regions 11b, whereby the silicon film 11 can be melted only in the first regions 11a over which the antireflection film 12 is formed.

On the other hand, the reflectance of the reflection film 13 is set to about 90% or greater because, as the thermal energy from laser light which is absorbed by the reflection film 13 increases, the reflection film 13 itself is more damaged. In the case where the reflectance of the reflection film 13 is about 90% or greater, damage caused by irradiation with laser light to the reflection film 13 is reduced, and therefore, the reflection film 13 can be used in a production method of a crystalline semiconductor film of the present invention. The reflection film 13 is made of, for example, a metal material which reflects visible light, i.e., which has brightness, such as chrome (Cr), tungsten (W), or aluminum (Al). A reflection film made of such a metal material has a high reflectance for laser light having a wavelength of about 308 nm. Especially, a reflection film made of aluminum has a reflectance of about 93%, which is the most preferable as the reflection film 13.

According to embodiment 1, the antireflection film 12 formed over the amorphous silicon film 11 is a silicon oxide film having a thickness of 54 nm. The reflection film 13 formed over the antireflection film 12 is an aluminum film having a thickness of 200 nm.

In embodiment 1, the antireflection film 12 is a silicon oxide film, and the reflection film 13 is an aluminum film. However, the antireflection film 12 and the reflection film 13 may have different structures, or may be respectively made of different materials, so long as the antireflection film 12 has a function for preventing reflection of laser light, and the reflection film 13 has a function for reflecting laser light.

Alternatively, for example, a silicon nitride film having a thickness of 300 nm or greater may be provided as a heating prevention film in substitution for the reflection film 13. Due to the silicon nitride film having such a thickness, the heat conducted to the first regions 11a of the silicon film 11 under the silicon nitride film is smaller than the heat conducted to the second regions 11b of the silicon film 11 over which the silicon nitride film is not formed. As a result, the temperature of the first regions 11a of the silicon film 11 is smaller than that of the second regions 11b of the silicon film 11 in the first laser light irradiation step. Thus, such a silicon nitride film functions as a heating prevention film having a equivalent function to that of the laser light reflection film 13, i.e., a function of preventing the first regions 11a from being melted.

In embodiment 1, the layers of the antireflection film 12 and the reflection film 13 are patterned into a stripe pattern such that each stripe has a width of 2 μm, and the stripes are arranged at an interval of 2 μm. In such a structure, the width of each of the first regions 11a and the second regions 11b is about 2 μm.

It is known that, in the case where an excimer laser whose pulse width is about 30 ns is used as laser light for irradiating the entire surface of the amorphous silicon film 11, the lateral crystal growth distance achieved by a single shot of the laser light is about 1 μm. Thus, when the width of each of the first regions 11a and the second regions 11b is about 2 μm, the laterally-growing crystal grains meet with each other at substantially the lateral center of each of the first regions 11a and the second regions 11b, and a crystal grain other than the laterally-grown crystal grains does not occur in the central portion of each of the first regions 11a and the second regions 11b. Thus, patterning the antireflection film 12 and the reflection film 13 such that each of the first regions 11a and the second regions 11b has a width of 2 μm, is advantageous for obtaining a crystalline film having crystal grains arranged in the same direction.

(4) After the antireflection film 12 and the reflection film 13 over the amorphous silicon film 11 are patterned into a predetermined shape, the first laser light irradiation step is performed on the resultant structure formed over the amorphous silicon film 11, so that amorphous silicon in the second regions 11b of the amorphous silicon film 11 is crystallized. In the first laser light irradiation step, a XeCl laser which emits laser light having a wavelength of 308 nm is used. The laser light emitted from the XeCl laser is homogenized by a beam homogenizer, and then shaped so as to have a rectangular beam spot.

The present invention is not limited to using a XeCl laser. Alternatively, other type of excimer laser, such as an ArF laser, KrF laser, XeF laser, or the like, may be used. The energy density of the laser light is set such that amorphous silicon in the second regions 11b of the amorphous silicon film 11 is completely melted. For example, in order to completely melt amorphous silicon in the second regions 11b of the amorphous silicon film 11 having a thickness of 45 nm, the energy density of the laser light is set to 430 mJ/cm$^2$ or greater.

Figure 3:
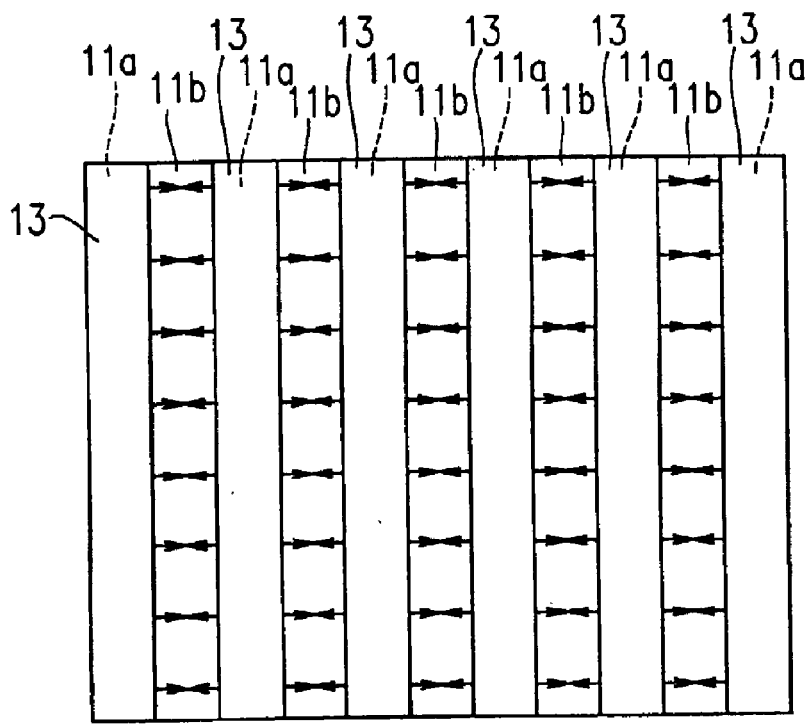
FIG. 3 is a plan view illustrating crystallization of the amorphous silicon film over the amorphous insulative substrate in the first laser light irradiation step.

After the first laser light irradiation with such laser light, crystal grains begin to grow in the second regions 11b laterally from longitudinal side faces of the first regions 11a, i.e., from the interfaces between the second regions 11b and the first regions 11a, which is not irradiated with the laser light, toward the central portions of the second regions 11b along the direction shown by the arrows in FIG. 1. FIG. 3 is a plan view of the structure shown in FIG. 1, illustrating crystallization of the amorphous silicon film 11 over the amorphous insulative substrate 10 in the first laser light irradiation step.

In each second region 11b of the amorphous silicon film 11, the crystal grains, which are growing laterally in the opposite directions indicated by the arrows in FIG. 1 from longitudinal side faces of the second region 11b, i.e., from the interfaces between the second region 11b and the neighboring first regions 11a, to the central portion of the second region 11b, meet with each other generally at substantially the lateral center of the second region 11b so that a grain boundary is formed substantially along the lateral center. By the first laser light irradiation, silicon crystal grains laterally grow over a distance equal to about a ½ of the width of the second region 11b. The resultant grain boundary area is filled with crystal grains such that the crystal grains are in contact with each other without leaving a gap.

(5) Thereafter, the reflection film 13 made of aluminum in the uppermost layer is etched away, so as to obtain a structure shown in FIG. 2.

(6) Then, the second laser light irradiation step is performed on the structure shown in FIG. 2. In embodiment 1, the silicon film 11 has a thickness of 45 nm. The laser light has an energy density between 330 mJ/cm$^2$ and 410 mJ/cm$^2$ inclusive.

Figure 4:
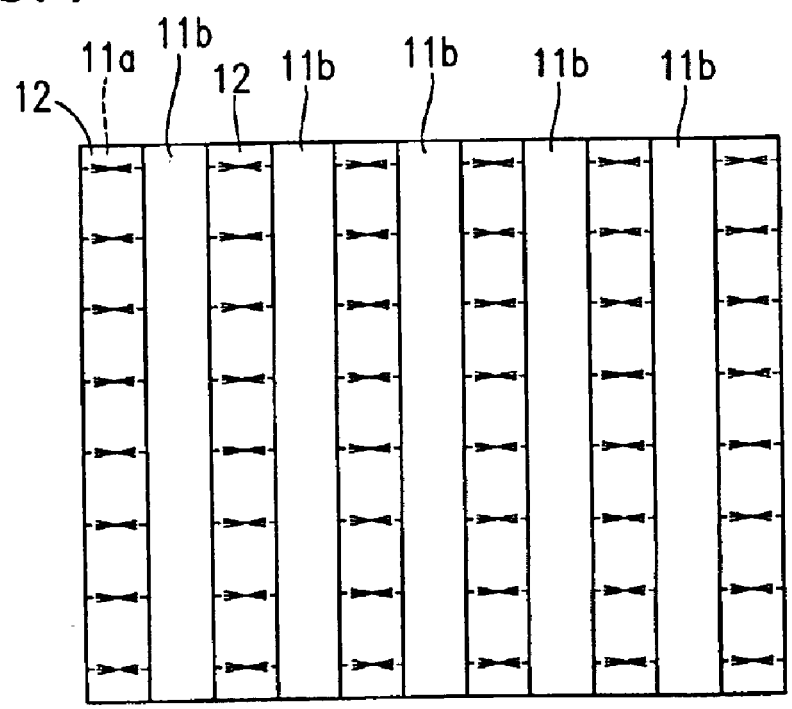
FIG. 4 is a plan view illustrating crystallization of the amorphous silicon film over the amorphous insulative substrate in the second laser light irradiation step.

By irradiation with the laser light having such an energy density, amorphous silicon in each first region 11a of the amorphous silicon film 11 begins to change into crystals which are laterally grown on the basis of crystal nuclei formed in the neighboring second regions 11b in the opposite directions indicated by the arrows in FIG. 2 from longitudinal side faces of the first region 11a, i.e., from the interfaces between first region 11a and the neighboring first regions 11a, to the central portion of the second region 11b. The crystal grains, which are growing laterally from the longitudinal side faces of the first region 11a, i.e., from the interfaces between the first region 11a and the neighboring second regions 11b, to the central portion of the first region 11a, meet with each other generally at substantially the lateral center of the first region 11a so that a uniform grain boundary is formed substantially along the lateral center. FIG. 4 is a plan view of the structure shown in FIG. 2, illustrating crystallization of the amorphous silicon film 11 over the amorphous insulative substrate 10 in the second laser light irradiation step. The grain boundary is filled with crystal grains such that the crystal grains are in contact with each other without leaving a gap. By the second laser light irradiation, silicon crystal grains laterally grow over a distance equal to about a ½ of the width of the first region 11a. Thus, the distance between adjacent grain boundaries is equal to or smaller than two times the lateral growth distance of silicon crystals achieved by a single shot of the laser light.

The laser light used in a formation method of the semiconductor film according to embodiment 1 has a top-hat shaped intensity distribution wherein a sufficient beam intensity is obtained even in a beam edge portion. The laser light having such an intensity distribution is emitted so as to continuously scan over the amorphous insulative substrate 10 such that a beam edge portion of a beam spot applied in a current beam shot turn slightly overlaps with beam edge portion of beam spots applied in previous beam shot turns, whereby crystals are grown in the amorphous silicon film 11. In this laser beam scanning process, the laser beam can be moved 10 times or more faster in comparison to a conventional crystallization method using a multiple-shot laser irradiation method (the previously-described first conventional method). As a result, the productivity of crystalline semiconductor films can be significantly increased.

In the case where laser light having a longer pulse width than that of the above-described laser light is used, or in the case where the pulse width of the laser light is extended using a pulse extender, the lateral growth distance of silicon crystals can be extended up to several micrometers. When the pulse width of the laser light is extended in such a way, it is necessary to increase the width of the antireflection film 12 and the reflection film 13 and the interval of the antireflection film 12 and the reflection film 13 according to the extension of the pulse width.

In embodiment 1, the silicon film 11 is amorphous before it is crystallized by irradiation with laser light. However, according to the present invention, even in a solid-phase grown polysilicon thin film or a polysilicon thin film formed by solid-phase growth performed while introducing Ni, Pd, or the like, crystal grains corresponding to the crystallinity of the thin film are grown by sequentially performing the above process steps.

If the crystallized silicon film 11 is used for producing a TFT, the antireflection film 12 on the silicon film 11 is removed after the crystallization processes have been completed. However, if the antireflection film 12 can be used as a gate insulation film of a TFT, a TFT production process wherein the antireflection film 12 is left unremoved is possible.

In the above-described semiconductor film production method of embodiment 1, a silicon thin film is crystallized to obtain a semiconductor film, but the present invention is not limited to the silicon film. The above-described production steps can be applied to other type of semiconductor film made from Ge, SiGe, or the like, in order to obtain a crystalline semiconductor film.

A semiconductor thin film produced by the above-described method of the present invention can be used to produce a TFT through a known TFT production method, wherein the semiconductor thin film serves as an active region. In such a TFT, the "active region" refers to the entire semiconductor thin film of the present invention which is patterned into a desired shape according to the design of the TFT.

In the semiconductor film of the present invention produced as described above, the laterally-grown crystal grains tend to be oriented such that the growth direction of the crystal grains is <100> direction. In a TFT produced using this semiconductor film, a high carrier mobility can be achieved along the growth direction of the crystal grains in the semiconductor film. This advantageous characteristic is utilized to produce a high performance TFT.

Now, consider an example where a plurality of TFTs are mixedly formed over an amorphous insulative substrate such that the directions of channel portions of the TFTs are perpendicular to each other. FIG. 5 shows two of TFT regions 15a and 15b provided on the amorphous insulative substrate. In each of the TFT regions 15a and 15b, the antireflection film 12 and the reflection film 13 are patterned into a stripe pattern so as to be parallel to the channel portion of a TFT which is to be formed.

In this way, two types of TFT regions 15a and 15b are formed over the amorphous insulative substrate 10 such that the longitudinal directions of the stripes of the antireflection film 12 and the reflection film 13 in the TFT region 15a are perpendicular to the longitudinal directions of the stripes of the antireflection film 12 and the reflection film 13 in the TFT region 15b. In such a structure, in each of the TFT regions 15a and 15b, the growth direction of the crystal grains of the semiconductor film is perpendicular to the direction of the stripes of the antireflection film 12 and the reflection film 13. In such a structure, a source region 21 and a drain region 22 are formed such that a channel portion of a TFT 20 is formed along the crystal growth direction as shown in parts (a) and (b) of FIG. 6, whereby a TFT which includes a channel region having high carrier mobility can be formed.

(Embodiment 2)

A crystalline semiconductor film according to embodiment 2 of the present invention is produced according to substantially the same steps as described above for producing the crystalline semiconductor film of embodiment 1, except that a semiconductor film is crystallized over its entire surface by, for example, heating using an electric furnace, or irradiating with laser light, prior to the first laser light irradiation step wherein crystal grains of silicon are grown laterally over a substrate surface, preferably prior to the formation of the striped reflection and antireflection films. In embodiment 2, such crystallization of a semiconductor film is performed in advance, whereby after the first laser light irradiation step, the diameter of crystal nuclei, which serve as seeds of crystals laterally grown in the second regions over which the reflection film and antireflection film are not formed, becomes large. Thus, if a TFT is formed such that its channel is formed along a direction perpendicular to the growth direction of crystal grains, the grain boundary which extends across the channel is reduced, and as a result, the characteristics of the TFT are improved. In this specification, the "channel direction" refers to the direction along which carriers in a field effect transistor flow from the source to the drain or from the drain to the source. On the other hand, if the channel is formed along the growth direction of the crystal grains, the carrier mobility in the channel region is increased as in embodiment 1, and the frequency by which the channel extends across a grain boundary is reduced. As a result, the production yield of the TFTs is increased.

Hereinafter, specific examples are described with reference to the drawings for explaining a method for producing a crystalline semiconductor film of embodiment 2.

EXAMPLE 1

FIG. 8 is a cross-sectional view illustrating a method for producing a semiconductor film of Example 1.

In the first step, as shown in FIG. 8(a), a SiO$_2$ film 22 was formed as a base coat film using a plasma CVD method so as to have a thickness of 300 nm over a glass substrate (Corning 1737) 21.

An amorphous silicon film 23 was then formed using a plasma CVD method so as to have a thickness of 45 nm over the $SiO_2$ film 22.

Then, the resultant structure was subjected to a heating treatment for 24 hours using an electric furnace containing nitrogen atmosphere at 600° C., so that the entire amorphous silicon film 23 was crystallized to obtain a crystalline silicon film 24.

Thereafter, a $SiO_2$ film 25 was formed as an antireflection film using a plasma CVD method so as to have a thickness of 53 nm over the crystalline silicon film 24. Then, an aluminum film 26 was formed as a reflection film by sputtering so as to have a thickness of 300 nm over the $SiO_2$ film 25.

The $SiO_2$ film 25 and the aluminum film 26 were patterned into a stripe pattern as shown in FIG. 8(b), with each stripe having a width of 2 μm, and an interval of the adjacent stripes being 2.5 μm. Specifically, the aluminum film (reflection film) 26 was first patterned by dry etching using $BCl_3$, and then, the patterned aluminum film 26 was used as a mask to etch the $SiO_2$ film (antireflection film) 25 using 5 wt % HF (hydrogen fluoride) into a desired pattern.

After the patterning of the $SiO_2$ film 25 and the aluminum film 26, the first laser light irradiation step was performed on the resultant structure, so that in the second region irradiated with the laser light, the crystalline silicon film 24 was melted and re-crystallized. The laser light used was a XeCl laser having a wavelength of 308 nm. Further, the energy density of the laser light was suitably adjusted such that crystalline silicon in the second region of the crystalline silicon film 24 was completely melted. In Example 1, the energy density of the laser light was 420 $mJ/cm^2$.

Then, the aluminum film (reflection film) 26 in the uppermost layer was etched away using a SLA etchant (phosphoric acid plus acetic acid).

Then, the second laser light irradiation step was performed on the resultant structure over the entire surface of the crystalline silicon film 24. In Example 1, the energy density of the laser light used in the second laser light irradiation step was 320 $mJ/cm^2$.

In both the first and second laser light irradiation steps, the beam size of the laser light was 0.8 mm×100 mm; the repetition rate (or oscillation frequency) was 50 Hz: and the stage feed speed was 40 mm/sec.

Then, the $SiO_2$ film (antireflection film) 25 was etched away using 5 wt % HF.

FIG. 12 is a plan view showing the crystalline state of a resultant polycrystalline silicon film formed by the above steps, which was observed using a scanning electron microscope (SEM). Referring to FIG. 12, crystals are laterally grown along the substrate surface. The length of crystal grains along the growth direction was about 2.2 μm, and the dimension (width) of crystal grains along a direction perpendicular to the growth direction was about 1.3 μm on average.

The thus-produced polycrystalline silicon film of Example 1 was used to produce an n-type TFT, where the polycrystalline silicon was used as a channel region of the TFT. In the case where a channel was formed such that the channel direction is perpendicular to the growth direction of crystal grains, the characteristic of the TFT, i.e., the carrier mobility, was 200 $cm^2/Vs$. In the case where a channel was formed such that the channel direction was identical to the growth direction of crystal grains, the characteristic of the TFT, i.e., the carrier mobility, was 350 $cm^2/Vs$.

EXAMPLE 2

FIG. 9 is a cross-sectional view illustrating a method for producing a semiconductor film of Example 2.

In the first step, as shown in FIG. 9(a), a $SiO_2$ film 22 was formed as a base coat film using a plasma CVD method so as to have a thickness of 300 nm over a glass substrate (Corning 1737) 21.

An amorphous silicon film 23 was then formed using a plasma CVD method so as to have a thickness of 45 nm over the $SiO_2$ film 22.

Then, the amorphous silicon film 23 was irradiated with XeCl laser light having a wavelength of 308 nm, so that the entire amorphous silicon film 23 was crystallized so as to obtain a crystalline silicon film 24. The energy density of the XeCl laser light was 420 $mJ/cm^2$.

Thereafter, a $SiO_2$ film 25 was formed as an antireflection film using a plasma CVD method so as to have a thickness of 53 nm over the crystalline silicon film 24. Then, an aluminum film 26 was formed as a reflection film by sputtering so as to have a thickness of 300 nm over the $SiO_2$ film 25.

The $SiO_2$ film 25 and the aluminum film 26 were patterned into a stripe pattern as shown in FIG. 9(b), with each stripe having a width of 2 μm, and an interval of the adjacent stripes being 2.5 μm. Specifically, the aluminum film (reflection film) 26 was first patterned by dry etching using $BCl_3$, and then, the patterned aluminum film 26 was used as a mask to etch the $SiO_2$ film (antireflection film) 25 using 5 wt % HF into a desired pattern.

After the patterning of the $SiO_2$ film 25 and the aluminum film 26, the first laser light irradiation step was performed on the resultant structure, so that in the second region irradiated with the laser light, the crystalline silicon film 24 was melted and re-crystallized. The laser light used was a XeCl laser having a wavelength of 308 nm. Further, the energy density of the laser light was suitably adjusted such that crystalline silicon in the second region of the crystalline silicon film 24 was completely melted. In Example 2, the energy density of the laser light was 450 $mJ/cm^2$.

Then, the aluminum film (reflection film) 26 in the uppermost layer was etched away using a SLA etchant (phosphoric acid plus acetic acid).

Then, the second laser light irradiation step was performed on the resultant structure over the entire surface of the crystalline silicon film 24. In Example 2, the energy density of the laser light used in the second laser light irradiation step was 320 $mJ/cm^2$.

In both the first and second laser light irradiation steps, the beam size of the laser light was 0.8 mm×100 mm; the repetition rate (or oscillation frequency) was 50 Hz; and the stage feed speed was 40 mm/sec.

Then, the $SiO_2$ film 25 was etched away using 5 wt % HF.

The crystalline state of the resultant polycrystalline silicon film formed through the above steps was observed using a SEM. For the polycrystalline silicon film of Example 2, substantially the same results as those for Example 1 shown in FIG. 12 were obtained. In Example 2 also, crystals are laterally grown along the substrate surface. The length of crystal grains along the growth direction was about 2.2 μm, and the dimension (width) of crystal grains along a direction perpendicular to the growth direction was about 1.4 μm on average.

The thus-produced polycrystalline silicon film of Example 2 was used to produce an n-type TFT, wherein the polycrystalline silicon was used as a channel region of the TFT. In the case where a channel was formed such that the channel direction was parallel to the growth direction of crystal grains, the characteristic of the TFT, i.e., the carrier mobility, was 350 cm$^2$/Vs.

EXAMPLE 3

FIG. 10 is a cross-sectional view illustrating a method for producing a semiconductor film of Example 3.

In the first step, as shown in FIG. 10(a), a SiO$_2$ film 22 was formed as a base coat film using a plasma CVD method so as to have a thickness of 300 nm over a glass substrate (Corning 1737) 21.

An amorphous silicon film 23 was then formed using a plasma CVD method so as to have a thickness of 45 nm over the SiO$_2$ film 22.

Then, the resultant structure was subjected to a heating treatment for 1 hour using an electric furnace containing a nitrogen atmosphere at 500° C., so that the amorphous silicon film 23 was dehydrogenated.

Thereafter, a SiO$_2$ film 25 was formed as an antireflection film using a plasma CVD method so as to have a thickness of 53 nm over the amorphous silicon film 23. Then, an aluminum film 26 was formed as a reflection film by sputtering so as to have a thickness of 300 nm over the SiO$_2$ film 25.

The SiO$_2$ film 25 and the aluminum film 26 were patterned into a stripe pattern as shown in FIG. 10(b), with each stripe having a width of 2 μm, and an interval of the adjacent stripes being 2.5 μm. Specifically, the aluminum film (reflection film) 26 was first patterned by dry etching using BCl$_3$, and then, the patterned aluminum film 26 was used as a mask to etch the SiO$_2$ film (antireflection film) 25 using 5 wt % HF into a desired pattern.

Then, the resultant structure was subjected to a heating treatment for 24 hours using an electric furnace containing a nitrogen atmosphere at 600° C., so that the entire amorphous silicon film 23 was crystallized so as to obtain a crystalline silicon film 24.

Thereafter, the first laser light irradiation step was performed on the resultant structure, so that in the second region irradiated with the laser light, the crystalline silicon film 24 was melted and re-crystallized. The laser light used was a XeCl laser having a wavelength of 308 nm. Further, the energy density of the laser light was suitably adjusted such that crystalline silicon in the second region of the crystalline silicon film 24 was completely melted. In Example 3, the energy density of the laser light was 420 mJ/cm$^2$.

Then, the aluminum film (reflection film) 26 in the uppermost layer was etched away using a SLA etchant (phosphoric acid plus acetic acid).

Then, the second laser light irradiation step was performed on the resultant structure over the entire surface of the crystalline silicon film 24. In Example 3, the energy density of the laser light used in the second laser light irradiation step was 320 mJ/cm$^2$.

In both the first and second laser light irradiation steps, the beam size of the laser light was 0.8 mm×100 mm; the repetition rate (or oscillation frequency) was 50 Hz; and the stage feed speed was 40 mm/sec.

Then, the SiO$_2$ film (antireflection film) 25 was etched away using 5 wt % HF.

The crystalline state of the resultant polycrystalline silicon film formed through the above steps was observed using a SEM. For the polycrystalline silicon film of Example 3, substantially the same results as those for Example 1 shown in FIG. 12 were obtained. In Example 3 also, crystals are laterally grown along the substrate surface. The length of crystal grains along the growth direction was about 2.2 μm, and the dimension (width) of crystal grains along a direction perpendicular to the growth direction was about 1.4 μm on average.

The thus-produced polycrystalline silicon film of Example 3 was used to produce an n-type TFT, where the polycrystalline silicon was used as a channel region of the TFT. In the case where a channel was formed such that the channel direction is perpendicular to the growth direction of crystal grains, the characteristic of the TFT, i.e., the carrier mobility, was 200 cm$^2$/Vs. In the case where a channel was formed such that the channel direction was identical to the growth direction of crystal grains, the characteristic of the TFT, i.e., the carrier mobility, was 350 cm$^2$/Vs.

EXAMPLE 4

FIG. 11 is a cross-sectional view illustrating a method for producing a semiconductor film of Example 4, wherein crystallization of an amorphous silicon film is not performed prior to the first laser light irradiation step.

In the first step, as shown in FIG. 11(a), a SiO$_2$ film 22 was formed as a base coat film using a plasma CVD method so as to have a thickness of 300 nm over a glass substrate (Corning 1737) 21.

An amorphous silicon film 23 was then formed using a plasma CVD method so as to have a thickness of 45 nm over the SiO$_2$ film 22.

Then, the resultant structure was subjected to a heating treatment for 1 hour using an electric furnace containing a nitrogen atmosphere at 500° C., so that the amorphous silicon film 23 was dehydrogenated.

Thereafter, a SiO$_2$ film 25 was formed as an antireflection film using a plasma CVD method so as to have a thickness of 53 nm over the amorphous silicon film 23. Then, an aluminum film 26 was formed as a reflection film by sputtering so as to have a thickness of 300 nm over the SiO$_2$ film 25.

The SiO$_2$ film 25 and the aluminum film 26 were patterned into a stripe pattern as shown in FIG. 11(b), with each stripe having a width of 2 μm, and an interval of the adjacent stripes being 2 μm. Specifically, the aluminum film (reflection film) 26 was first patterned by dry etching using BCl$_3$, and then, the patterned aluminum film 26 was used as a mask to etch the SiO$_2$ film (antireflection film) 25 using 5 wt % HF into a desired pattern.

After the patterning of the SiO$_2$ film 25 and the aluminum film 26, the first laser light irradiation step was performed on the resultant structure, so that in the second region irradiated with the laser light, amorphous silicon of the amorphous silicon film 23 was melted and crystallized. The laser light used was a XeCl laser having a wavelength of 308 nm. Further, the energy density of the laser light was suitably adjusted such that amorphous silicon in the second region of the amorphous silicon film 23 was completely melted. In Example 4, the energy density of the laser light was 420 mJ/cm$^2$.

Then, the aluminum film (reflection film) 26 in the uppermost layer was etched away using a SLA etchant (phosphoric acid plus acetic acid).

Then, the second laser light irradiation step was performed on the resultant structure over the entire surface of the amorphous silicon film 23. In Example 4, the energy density of the laser light used in the second laser light irradiation step was 320 mJ/cm².

In both the first and second laser light irradiation steps, the beam size of the laser light was 0.8 mm×100 mm; the repetition rate (or oscillation frequency) was 50 Hz; and the stage feed speed was 40 mm/sec.

Then, the SiO₂ film 25 was etched away using 5 wt % HF.

FIG. 13 is a plan view showing the crystalline state of a resultant polycrystalline silicon film formed by the above steps, which was observed using a SEM.

Referring to FIG. 13, crystals are laterally grown along the substrate surface. The length of crystal grains along the growth direction was about 2 μm, and the dimension (width) of crystal grains along a direction perpendicular to the growth direction was about 0.3 μm on average.

The thus-produced polycrystalline silicon film of Example 4 was used to produce an n-type TFT, where the polycrystalline silicon was used as a channel region of the TFT. In the case where a channel was formed such that the channel direction is perpendicular to the growth direction of crystal grains, the characteristic of the TFT, i.e., the carrier mobility, was 100 cm²/Vs. In the case where a channel was formed such that the channel direction was identical to the growth direction of crystal grains, the characteristic of the TFT, i.e., the carrier mobility, was 300 cm²/Vs.

From the above, the differences found between Examples 1–3 and Example 4 are as follows.

(1) As clearly seen from FIGS. 12 and 13, in the case where the method of one of Examples 1–3 is used, the dimension (width) of crystal grains which is perpendicular to the growth direction of the crystal grains is longer as compared with the case where the method of Example 4 is used.

(2) In the case where a TFT is produced using the method of one of Examples 1–3 where a channel is formed such that the channel direction is perpendicular to the growth direction of crystal grains, the characteristics of the TFT are enhanced in comparison to a case where the method of Example 4 is used.

(3) In the case where a TFT is produced using the method of one of Examples 1–3 where a channel is formed such that the channel direction is identical to the growth direction of crystal grains, the characteristics of the TFT are substantially the same as those for when the method of Example 4 is used. However, when the method of one of Examples 1–3 is used, the dimension (width) of crystal grains which is perpendicular to the growth direction of the crystal grains is slightly greater in comparison to the case where the method of Example 4 is used, and therefore, the frequency that the channel extends across a grain boundary is reduced. As a result, the production yield of the TFTs is increased.

(Embodiment 3)

A crystalline semiconductor film according to embodiment 3 of the present invention is produced according to substantially the same steps as described above for producing the crystalline semiconductor films of embodiments 1 and 2, except that a cap film made of a single material having a predetermined thickness is provided over an amorphous semiconductor thin film in a stripe pattern, and the amorphous semiconductor thin film with the cap film provided thereon is irradiated with two types of laser light having different wavelengths. The thickness of the cap film is determined so as to function as both a heating prevention film and an antireflection film for the two types of laser light having different wavelengths, respectively. Thus, in embodiment 3, the thickness of the cap film and the wavelengths of the two types of laser light must be suitably determined.

Hereinafter, the wavelengths of the two types of laser light used, and determination of the thickness of the cap film, in a production method of a crystalline semiconductor thin film of embodiment 3 are specifically described. In the descriptions below, a silicon thin film is used as a semiconductor thin film.

At a step where the cap layer formed into a stripe pattern over the amorphous silicon thin film is irradiated with laser light, the reflectance of the cap film is maximum when Expression (2) below is satisfied:

$$d=\lambda \cdot 2k/4n \quad (2),$$

where d=thickness of cap film;
λ=wavelength of laser light;
n=refractive index of cap film; and
k=0, 1, 2, . . . .

When the laser light is irradiated under the condition of Expression (2), an increase in temperature of the amorphous silicon under the cap film, which may be caused by irradiation with laser light, is prevented due to the presence of the cap film. As a result, the amorphous silicon film under the cap film is not heated, and hence not melted, by irradiation with laser light, whereas the amorphous silicon film over which the cap film is not provided is heated and melted by irradiation with laser light, and then crystallized. That is, in this case, the cap film functions as a heating prevention film.

On the other hand, the reflectance of the cap film is minimum when Expression (3) below is satisfied:

$$d=\lambda' \cdot (2k'+1)/4n \quad (3),$$

where d=thickness of cap film;
λ'=wavelength of laser light (λ'≠λ);
n=refractive index of cap film; and
k'=0, 1, 2, . . . .

When the laser light is irradiated under the condition of Expression (3), the reflectance of the cap film is low in comparison to a region where the cap film is not provided, and accordingly, an increase in temperature caused by laser light irradiation is accelerated in a portion of the amorphous film under the cap film. As a result, the amorphous silicon film under the cap film is heated and melted, and then crystallized by irradiation with laser light, whereas in the amorphous silicon film over which the cap film is not provided, the temperature of amorphous silicon is not increased in comparison to a region where the cap film is provided, so that the amorphous silicon film in this portion is kept unmelted. That is, in this case, the cap film functions as an antireflection film.

In embodiment 3, as described above, the cap film functions as both a heating prevention film and an antireflection film for the two types of laser light having different wavelengths, respectively. Thus, the thickness of the cap film (d) is the same for the above two cases, i.e., the right side of Expression (2) is equal to the right side of Expression (3), which is represented as Expression (4):

$$\lambda'/\lambda=2k/(2k'+1) \quad (4).$$

The wavelengths of the two types of laser light, λ and λ', are set such that Expression (4) is satisfied. So long as the wavelengths of the laser light are set such that Expression (4) is substantially satisfied, the cap film having thickness d functions as a heating prevention film when the cap film is irradiated with the laser light having wavelength λ; and the cap film having thickness d functions as an antireflection film when the cap film is irradiated with the laser light having wavelength λ'.

When the cap film functions as an antireflection film, it is preferable that the reflectance of the cap film is lower than that a portion of the silicon film which is not covered with the cap film by 20% or more. With such an arrangement, a large difference in thermal energy provided by laser light irradiation occurs between regions covered with the cap film and the other regions not covered with the cap film. Thus, the cap film sufficiently functions as an antireflection film.

FIG. 14 is a graph showing the relationship between the thickness and the reflectance of a silicon oxide film (n=1.42) which is used as the cap film. In the graph of FIG. 14, a YAG laser is used for providing laser light having a wavelength of 532 nm; a XeCl excimer laser is used for providing laser light having a wavelength of 308 nm; and a KrF excimer laser is used for providing laser light having a wavelength of 248 nm.

Now consider that the KrF excimer laser is used for producing laser light having wavelength λ which allows the cap film made of a silicon oxide film to function as a heating prevention film, and the XeCl excimer laser is used for producing laser light having wavelength λ' which allows the cap film to function as an antireflection film. As seen from the graph of FIG. 14, when the thickness of the cap film (d) is about 155 nm, the reflectance of the cap film for the KrF excimer laser light is 56%, i.e., near the maximum value. In this case, it is suitable for the cap film to function as a heating prevention film. At the same time, the reflectance of the cap film for the XeCl excimer laser light is 31%, i.e., is near the minimum value as shown in FIG. 14. This reflectance is lower than that of a region over which the silicon oxide film (cap film) is not provided by about 25%. Thus, it is suitable for the cap film to function as an antireflection film. Applying these values to Expression (4) for confirmation, the left side of Expression (4) is λ'/λ=1.2, and the right side of Expression (4) is 2k/(2k'+1)=1.3 (substituting k for 2 (k=2) and k' for 1 (k'=1)), and therefore, Expression (4) is almost satisfied. Thus, a silicon oxide film having the thickness of 155 nm functions as a heating prevention film for the KrF excimer laser light and as an antireflection film for the XeCl excimer laser light.

It should be noted that the present invention is not limited to the above silicon oxide film having a thickness of 155 nm and the above laser light examples. According to the present invention, other types of films different from the silicon oxide film may be used as the cap film, and various combinations of laser light may be employed, so long as the thickness of the cap film is set to an optimum thickness according to the wavelengths of laser light used.

Other exemplary combinations of the thickness of the cap film, which is used as both the heating preventing film and antireflection film, and the wavelengths of two types of laser light used, are shown in Table 1 below. According to the present invention, a silicon nitride film may be used as the cap film. Further, the thickness of the cap film may be more or less deviated from the values shown in Table 1, so long as the cap film sufficiently functions as both the heating preventing film and antireflection film.

TABLE 1

| Cap film | λ (nm) | λ' (nm) | d (nm) |
|---|---|---|---|
| $SiO_2$ | 308 | 248 | 212 |
| $SiO_2$ | 248 | 308 | 155 |
| $SiO_2$ | 308 | 532 | 90 |
| $SiO_2$ | 248 | 532 | 80 |
| $SiN_x$ | 248 | 308 | 110 |
| $SiN_x$ | 308 | 532 | 70 |
| $SiN_x$ | 248 | 532 | 50 |

Wavelength 308 nm . . . XeCl excimer laser
Wavelength 248 nm . . . KrF excimer laser
Wavelength 532 nm . . . Nd:YAG excimer laser Next, a production method of a crystalline semiconductor film according to embodiment 3 of the present invention is specifically described with reference to FIGS. 15 and 16.

In the first step, an amorphous silicon film 32 is formed over the entire surface of an amorphous insulative substrate 31. In the case where the thickness of the amorphous silicon film 32 is between 30 nm and 100 nm, a TFT can be preferably produced.

Then a silicon oxide film 33 is formed over the amorphous silicon film 32 and patterned into a stripe pattern. In embodiment 3, the silicon oxide film 33 has a thickness of 155 nm, and functions as both an antireflection film and heating prevention film respectively for predetermined laser light wavelengths.

Then, after the patterning of the silicon oxide film 33 into a stripe pattern, the resultant structure is sequentially irradiated with two types of laser light having different wavelengths (first and second laser light irradiation steps). Each laser light is homogenized by a beam homogenizer, and then shaped so as to have a rectangular beam spot.

In the first laser light irradiation step, a KrF excimer laser which emits laser light having a wavelength of 248 nm is used. The energy density of the KrF excimer laser light is set such that portions of the silicon film 32 over which the silicon oxide film 33 is not provided, i.e., portions 32b, are completely melted while the other portions of the silicon film 32 over which the silicon oxide film 33 is provided, i.e., portions 32a, are not completely melted. By the irradiation with the KrF excimer laser light, the portions of the silicon film 32 over which the silicon oxide film 33 is not provided (portions 32b) are completely melted because of an increase of temperature caused by laser light irradiation, whereas the other portions of the silicon film 32 over which the silicon oxide film 33 is provided (portions 32a) are not completely melted (although partially melted) because the silicon oxide film 33 functions as a heating prevention film so that an increase in temperature caused by laser light irradiation is prevented in comparison to the portions of the silicon film 32 over which the silicon oxide film 33 is not provided. As a result of the laser light irradiation, in the completely-melted region (portions 32b), lateral growth of silicon crystals begins on the basis of crystal nuclei present in the partially-melted region, from longitudinal side faces of the completely-melted region toward the central portion of the completely-melted region along the direction shown by the arrows in FIG. 17. In the completely-melted region, the crystal grains, which are growing laterally in the opposite directions indicated by the arrows in FIG. 17, meet with each other at substantially the lateral center of the completely-melted region so that a grain boundary is formed uniformly along the lateral center. The resultant grain boundary area is filled with crystal grains such that the crystal grains are in contact with each other without leaving a gap.

Thereafter, the second laser light irradiation step is performed on the resultant structure. In the second laser light irradiation step, a XeCl excimer laser which emits laser light having a wavelength of 308 nm is used. The energy density of the XeCl excimer laser light is set such that the portions of the silicon film 32 over which the silicon oxide film 33 is provided, i.e., portions 32a, are completely melted while the other portions of the silicon film 32 over which the silicon oxide film 33 is not provided, portions 32a, are not completely melted. By the irradiation with the XeCl excimer laser light, the portions of the silicon film 32 over which the silicon oxide film 33 is provided (portions 32a) are completely melted, because reflection of the laser light is prevented on the surface of the silicon oxide film 33 so that the temperature of the region under the silicon oxide film 33 (portions 32a) readily increases in comparison to the portion over which the silicon oxide film 33 is not provided (portions 32b). On the other hand, in the other portions of the silicon film 32 over which the silicon oxide film 33 is not provided (portions 32b), reflection of the XeCl excimer laser light is larger than the reflection by the surface of the silicon oxide film 33. Thus, in these regions, an increase of temperature is suppressed, so that the silicon film 32 is not completely melted (although partially melted). As a result of the laser light irradiation, in the completely-melted region, lateral growth of silicon crystals begins on the basis of crystal nuclei present in the partially-melted region, from longitudinal side faces of the completely-melted region toward the central portion of the completely-melted region along the direction shown by the arrows in FIG. 18. In the completely-melted region, the crystal grains, which are growing laterally in the opposite directions indicated by the arrows in FIG. 18, meet with each other at substantially the lateral center of the completely-melted region so that a grain boundary is formed uniformly along the lateral center. The resultant grain boundary area is filled with crystal grains such that the crystal grains are in contact with each other without leaving a gap.

In the above example of embodiment 3, the KrF excimer laser light is applied in the first laser light irradiation step while using a silicon oxide film as a heating prevention film, so as to crystallize a portion of a silicon thin film over which the silicon oxide film is not provided; and then, the XeCl excimer laser light is applied in the second laser light irradiation step while using the silicon oxide film as a antireflection film, so as to crystallize a portion of the silicon thin film over which the silicon oxide film is provided. However, according to the present invention, substantially the same crystallinity can be obtained even when the XeCl excimer laser light is applied in the first laser light irradiation step, and the KrF excimer laser light is then applied in the second laser light irradiation step.

Next, a method for irradiating an amorphous silicon thin film with two types of laser beams having different wavelengths is described.

In a first method, irradiation with laser light is performed in two steps. Specifically, a first laser light irradiation step is performed over the entire surface of a silicon thin film, and then, a second laser light irradiation step is performed over the entire surface of the silicon thin film with laser light having a different wavelength from that used in the first laser light irradiation step. This method can be achieved with the simplest crystallization apparatus structure in comparison to second and third methods which will be described later, but the entire surface of the silicon thin film must be scanned with laser light twice because of the two laser light irradiation steps. Thus, a longer time is required for crystallization.

In the second method, two types of laser light beams are applied concurrently over an amorphous silicon thin film. FIG. 19 illustrates concurrent application of the two types of laser light beams of the second method. For example, in an laser light irradiation system used in the second method, two optical units 41 for applying laser light over the amorphous silicon film are provided side by side along a scanning direction of a substrate 40 over which the amorphous silicon film is crystallized. First laser light having a first wavelength is supplied to the corresponding optical unit 41 through an optical mirror, or the like, from a first laser oscillation device (not shown), while second laser light having a second wavelength is supplied to the other optical unit 41 through another optical mirror, or the like, from a second laser oscillation device (not shown). The optical units 41 shape the first and second laser light and apply the shaped laser light on the amorphous silicon film such that laser beam spots 42a and 42b which are elongated in a direction perpendicular to the scanning direction of the substrate 40 are formed over the substrate 40. In this second method, crystallization of the amorphous silicon film over the entire substrate can be achieved by a single scanning operation, and therefore, the time used for crystallization can be reduced.

In the third method, a single optical system, such as a beam homogenizer or the like, is used to alternately apply two types of laser light having different wavelengths. This method is effective when the laser light applied is pulsed laser light. As shown in FIG. 20, first and second laser devices emit pulse waves at the same frequency at different timings, such that first and second laser light beams are alternately applied on the amorphous silicon film with alternate timings. In this third method also, crystallization of the amorphous silicon film over the entire substrate can be achieved by a single scanning operation as in the second method, and therefore, the time used for crystallization can also be reduced.

A semiconductor thin film produced by the above-described methods of the present invention can be used to produce a TFT through a known TFT production method. In a TFT produced using the semiconductor film produced by the crystallization method of embodiment 3, a high carrier mobility can be achieved along the growth direction of crystal grains in a channel region of the TFT. Thus, in the case where TFTs are formed on the same substrate such that their channel directions are perpendicular to each other, a cap film formed on a silicon thin film for each TFT region for crystallization of the silicon thin film is patterned in a stripe pattern such that the stripes are parallel to a channel direction of a TFT to be formed in the TFT region, whereby in each of the resultant TFTs having different channel directions, high carrier mobility can be achieved.

(Embodiment 4)

FIG. 21 is a cross-sectional view illustrating a method for forming an amorphous silicon film in a production method of a crystalline semiconductor film according to embodiment 4 of the present invention. In the first step, over a glass substrate 105 made of Corning 1737, a silicon oxide film is formed by a P-CVD method as a base coat film 106 so as to have a thickness of 300 nm. Then, an a-Si film 102 was formed over the base coat film 106 by a P-CVD method so as to have a thickness of 45 nm. After the a-Si film 102 and the base coat film 106 have been formed on the glass substrate 105, the resultant structure is heated for 1 hour in an electric furnace containing nitrogen atmosphere at 500° C., so that the a-Si film 102 is dehydrogenated.

FIG. 22 is a cross-sectional view illustrating a step of forming a heating/cooling suppression film in the crystalline semiconductor film formation method. FIG. 23 is a perspective view of the structure shown in FIG. 22. After the dehydrogenation of the a-Si film 102, a silicon oxide film is formed by a P-CVD method over the a-Si film 102. The silicon oxide film formed over the a-Si film 102 is then patterned by etching with 5 wt % HF into a stripe pattern, so as to obtain a plurality of heating/cooling suppression films 101 such that the stripes are arranged at an interval of 2 micrometers, and each stripe has a width of 2 micrometers.

Herein, a portion of the a-Si film 102 which is covered with the heating/cooling suppression films 101 is referred to as a "cap region a-Si film 103", and a portion of the a-Si film 102 which is not covered with the heating/cooling suppression films 101 is referred to as a "bare region a-Si film 104".

FIG. 24 is a graph which illustrates the relationship between the thickness of the heating/cooling suppression films 101 and the energy for completely-melting the cap region. The horizontal axis represents the thickness of the heating/cooling suppression films 101 formed over the a-Si film 102, and the vertical axis represents the amount of laser energy required to completely melt the cap region a-Si film 103 covered with the heating/cooling suppression films (silicon oxide films) 101 (hereinafter, referred to as a "energy for completely-melting the cap region".

The reflectance of the heating/cooling suppression films 101 varies according to its thickness. Thus, the amount of energy obtained from laser light which reaches the cap region a-Si film 103 varies according to the thickness of the heating/cooling suppression films 101. Thus, the energy for completely-melting the cap region varies according to the thickness of the heating/cooling suppression films 101. The variation of the reflectance of the heating/cooling suppression films 101 is reflected in the energy for completely-melting the cap region, and as a result, the energy for completely-melting the cap region varies over the thickness of the heating/cooling suppression films 101 in a cosine curve manner as shown in FIG. 24.

In the case where the heating/cooling suppression films 101 is made of a material having a large thermal capacity, such as a silicon oxide film, as the thickness of the heating/cooling suppression films 101 increases, the amount of energy absorbed by the heating/cooling suppression films 101 and consumed for an increase of temperature of the heating/cooling suppression films 101 is increased. This characteristic is represented by the cosine curve of FIG. 24 which varies in a cosine curve manner along with an increase of the thickness of the heating/cooling suppression films 101. As seen from FIG. 24, in some ranges of the thickness of the heating/cooling suppression films 101, the energy for completely-melting the cap region exceeds the laser energy required for completely melting the bare region a-Si film 104 (hereinafter, the "energy for completely-melting the bare region").

The condition for the energy for completely-melting the cap region exceeding the energy for completely-melting the bare region is that the thickness d of the heating/cooling suppression films 101 is equal to or greater than $(3\lambda)/(8n)$, where $\lambda$ denotes the wavelength of laser light applied, and n denotes the refractive index of the heating/cooling suppression films 101.

The thickness of the heating/cooling suppression films 101 formed over the a-Si film 102 has a thickness such that the energy for completely-melting the cap region is greater than the energy for completely-melting the bare region, for example, about 203 nm. In our experimentation where the cap region a-Si film 103 is covered with the heating/cooling suppression films 101 having a thickness of about 203 nm, the energy required for completely melting the cap region a-Si film 103 with the XeCl laser was about 550 mJ/cm². The energy required for completely melting the bare region a-Si film 104 with the XeCl laser was about 440 mJ/cm².

FIG. 25 is a cross-sectional view illustrating a first laser light irradiation step. In this step, a XeCl laser device emits first laser light 107 having an energy density of 590 mJ/cm², which is greater than the energy for completely-melting the cap region of 550 mJ/cm², at a wavelength of 308 nm over the a-Si film 102 from the side where the heating/cooling suppression films 101 is formed. The beam size of the laser light 107 is 0.5 mm×100 mm; the repetition ratio is 80 Hz; and the stage feed speed is 40 mm/sec.

When irradiation is performed with the laser light 107 having a larger energy than the energy for completely-melting the cap region, both the cap region a-Si film 103 covered with the heating/cooling suppression films 101 and the bare region a-Si film 104 not covered with the heating/cooling suppression films 101 are completely melted.

FIG. 26 is a perspective view illustrating a cap region crystallization step. FIG. 27 is a plan view of the structure shown in FIG. 26. Referring to FIGS. 25, 26, and 27, since the heating/cooling suppression films 101 are made of a silicon oxide film having a large thermal capacity, cooling of the cap region a-Si film 103 is suppressed by the heating/cooling suppression films 101 covering the cap region a-Si film 103. Thus, the bare region a-Si film 104 solidifies faster than the cap region a-Si film 103 because cooling of the cap region a-Si film 103 is suppressed by the heating/cooling suppression films 101.

In the cap region a-Si film 103, crystal grains laterally grow from longitudinal side faces of the cap region a-Si film 103 to the central portions of the cap region a-Si film 103 along the direction shown by the arrows in FIGS. 25, 26, and 27, on the basis of crystal nuclei present in the bare region a-Si film 104 which has been solidified faster than the cap region a-Si film 103.

FIG. 28 is a cross-sectional view illustrating a second laser light irradiation step. In this step, a XeCl laser device emits second laser light 108 having an energy density of 450 mJ/cm², which is greater than the energy for completely-melting the bare region of 440 mJ/cm² and is smaller than the energy for completely-melting the cap region of 550 mJ/cm², at a wavelength of 308 nm over the a-Si film 102 from the side where the heating/cooling suppression films 101 is formed. The beam size of the laser light 108 is 0.5 mm×100 mm, which is the same as that of the laser light 107; the repetition ratio is 80 Hz; and the stage feed speed is 40 mm/sec.

When irradiation is performed with the laser light 108 having an energy density which is greater than the energy for completely-melting the bare region and is smaller than the energy for completely-melting the cap region, heating of the cap region a-Si film 103 is suppressed by the heating/cooling suppression films 101, and as a result, only the bare region a-Si film 104 is completely melted.

FIG. 29 is a perspective view illustrating a bare region crystallization step. FIG. 30 is a plan view of the structure shown in FIG. 29. Referring to FIGS. 28, 29, and 30, in the completely-melted bare region a-Si film 104, crystal grains laterally grow from longitudinal side faces of the bare region a-Si film 104 to the central portions of the bare region a-Si film 104 along the direction shown by the arrows in FIGS. 28, 29, and 30, on the basis of crystal nuclei present in the cap region a-Si film 103, in which heating of the cap region a-Si film 103 is suppressed by the heating/cooling suppression films 101.

Then, the heating/cooling suppression films 101 are etched away from the a-Si film 102 using 5 wt % HF.

FIG. 31 is a plan view schematically showing a crystalline silicon film according to embodiment 4, where the crystalline state of a crystalline silicon film 109 observed using a SEM after the removal of the heating/cooling suppression films 101 is shown. In the cap region a-Si film 103, crystals are laterally grown from longitudinal side faces of the cap region a-Si film 103, i.e., from the interfaces between the cap region a-Si film 103 and the bare region a-Si film 104, toward the central portion of the cap region a-Si film 103. The crystal grains, which are growing laterally in the opposite directions, meet with each other at substantially the lateral center of the cap region a-Si film 103 so that a grain boundary is formed along the longitudinal direction of the cap region a-Si film 103.

In the bare region a-Si film 104, crystals are laterally grown from longitudinal side faces of the bare region a-Si film 104, i.e., from the interfaces between the cap region a-Si film 103 and the bare region a-Si film 104, toward the central portion of the bare region a-Si film 104. The crystal grains, which are growing laterally in the opposite directions, meet with each other at substantially the lateral center of the bare region a-Si film 104 so that a grain boundary is formed along the longitudinal direction of the bare region a-Si film 104.

The resultant crystalline silicon film 109 is filled with laterally-grown crystal grains such that the crystal grains are in contact with each other without leaving a gap.

The thus-produced crystalline silicon film 109 was used to produce an n-channel TFT where a channel was formed along a width direction of the crystal grains (first n-channel TFT), and another n-channel TFT where a channel was formed along the crystal growth direction (second n-channel TFT).

In the first n-channel TFT, the carrier mobility was 110 cm$^2$/Vs. In the second n-channel TFT, the carrier mobility was 300 cm$^2$/Vs. The percent defective which was determined based on a variation in threshold voltage was 0/100. That is, the threshold voltage was measured for 100 second n-channel TFTs, and no defective TFT was found.

As described above, the production method of a crystalline semiconductor film according to embodiment 4 includes a semiconductor film formation step, a heating/cooling suppression film formation step, a first irradiation step, a cap region crystallizing step, a second irradiation step, a bare region crystallizing step, and a removal step. In the semiconductor film formation step, an a-Si film 102 is formed over the glass substrate 105. In the heating/cooling suppression film formation step, a plurality of heating/cooling suppression films 101 is formed over the a-Si film 102 into a stripe pattern arranged at a certain interval so as to have a thickness such that the energy for completely-melting the cap region which is required for completely melting the cap region a-Si film 103 covered with the heating/cooling suppression film 101 is greater than the energy which is required for completely melting the bare region a-Si film 104 not covered with the heating/cooling suppression film 101. In the first irradiation step, laser light having an energy density which is greater than the energy for completely-melting the cap region is applied over the a-Si film 102 from the side where the heating/cooling suppression films 101 is formed, such that the cap region a-Si film 103 and the bare region a-Si film 104 are completely melted. In the cap region crystallizing step, the cap region a-Si film 103, in which cooling of the cap region a-Si film 103 is suppressed by the heating/cooling suppression film 101, is crystallized on the basis of crystal nuclei present in the bare region a-Si film 104 which has been solidified faster than the cap region a-Si film 103. In the second irradiation step performed after the cap region crystallizing step, the laser light 108 having an energy which is greater than the energy for completely-melting the bare region and is smaller than the energy for completely-melting the cap region is applied over the a-Si film 102 from the side where the heating/cooling suppression films 101 is formed, such that heating of the cap region a-Si film 103 is suppressed by the heating/cooling suppression films 101, and as a result, only the bare region a-Si film 104 is completely melted. In the bare region crystallizing step, the completely-melted bare region a-Si film 104 is crystallized on the basis of crystal nuclei present in the cap region a-Si film 103. In the removal step, the heating/cooling suppression films 101 is removed from the a-Si film 102.

Thus, according to embodiment 4, it is only necessary to form the heating/cooling suppression films 101 over the a-Si film 102. It is not necessary to form over the a-Si film 102 two layers, i.e., an antireflection film and a reflection film, which are formed in embodiment 1. Thus, the production method of a crystalline semiconductor film can be simplified, and accordingly, the production cost can be reduced.

Further, between the first and second laser light irradiation steps, it is not necessary to remove a glass substrate from a laser apparatus in order to remove a reflection film, or return the glass substrate from which the reflection film has been removed into the laser apparatus. Thus, the production method of a crystalline semiconductor film can be further simplified, and accordingly, the production cost can be further reduced.

In the above-described example of embodiment 4, the heating/cooling suppression films 101 are made of a silicon oxide film, but the present invention is not limited thereto. The heating/cooling suppression films 101 may be made of a silicon nitride film, or a layered film including a silicon oxide film and a silicon nitride film.

Next, an alternative production method of a crystalline semiconductor film according to embodiment 4 is described. This alternative production method is different from the crystalline semiconductor film production method described above with reference to FIGS. 21 through 31, in that: the thickness of the heating/cooling suppression films 101 is 101 nm; the energy for completely-melting the cap region is about 480 mJ/cm$^2$ because the heating/cooling suppression films 101 is set to 101 nm; and the energy density of the first laser light 107 is 510 mJ/cm$^2$, which is greater than the energy for completely-melting the cap region of 480 mJ/cm$^2$. The other details are substantially the same, and therefore, detailed descriptions thereof are herein omitted.

A crystalline silicon film produced by the alternative crystalline semiconductor film production method was observed using a SEM. As seen in the crystalline silicon film 109 produced by the above-described crystalline semiconductor film production method, in the alternative crystalline silicon film also, crystals were laterally grown in the cap region a-Si film 103 from longitudinal side faces of the cap region a-Si film 103, i.e., from the interfaces between the cap region a-Si film 103 and the bare region a-Si film 104, toward the central portion of the cap region a-Si film 103, as shown in FIG. 31. The crystal grains, which were growing laterally in the opposite directions from the longitudinal side faces to the central region, met with each other at substantially the lateral center of the cap region a-Si film 103 so that a grain boundary was formed along the longitudinal direction of the cap region a-Si film 103.

In the bare region a-Si film 104, crystals were laterally grown from longitudinal side faces of the bare region a-Si film 104, i.e., from the interfaces between the cap region a-Si film 103 and the bare region a-Si film 104, toward the central portion of the bare region a-Si film 104. The crystal grains, which were growing laterally in the opposite directions from the longitudinal side faces to the central region, met with each other at substantially the lateral center of the bare region a-Si film 104 so that a grain boundary is formed along the longitudinal direction of the bare region a-Si film 104.

The resultant crystalline silicon film is filled with laterally-grown crystal grains such that the crystal grains are in contact with each other without leaving a gap.

The thus-produced crystalline silicon film was used to produce an n-channel TFT where a channel was formed along a width direction of the crystal grains (first n-channel TFT), and another n-channel TFT where a channel was formed along the crystal growth direction (second n-channel TFT).

In the first n-channel TFT, the carrier mobility was 100 $cm^2/Vs$. In the second n-channel TFT, the carrier mobility was 295 $cm^2/Vs$. The percent defective which was determined based on a variation in threshold voltage was 0/100. That is, the threshold voltage was measured for 100 second n-channel TFTs, and no defective TFT was found.

Next, a comparative example of a production method of a crystalline semiconductor film is described. FIG. 32 is a plan view illustrating the production method of a crystalline semiconductor film of the comparative example. The production method of the comparative example was different from the crystalline semiconductor film production method described above with reference to FIGS. 21 through 31, in that: the thickness of the heating/cooling suppression films 101 was 53 nm such that the energy for completely-melting the cap region was smaller than the energy for completely-melting the bare region; and as a result, the energy for completely-melting the cap region was about 360 $mJ/cm^2$, which was smaller than the energy for completely-melting the bare region of 440 $mJ/cm^2$. The energy density of the first laser light 107 was 450 $mJ/cm^2$, which was greater than the energy for completely-melting the bare region of 440 $mJ/cm^2$ and the energy for completely-melting the cap region of 360 $mJ/cm^2$. The energy density of the second laser light 108 was 400 $mJ/cm^2$, which was greater than the energy for completely-melting the cap region of 360 $mJ/cm^2$ and smaller than the energy for completely-melting the bare region of 440 $mJ/cm^2$. The other details are substantially the same, and therefore, detailed descriptions thereof are herein omitted.

A crystalline silicon film produced by the production method of the comparative example was observed using a SEM. As shown in FIG. 32, crystals were laterally grown in the cap region a-Si film 103 from longitudinal side faces of the cap region a-Si film 103, i.e., from the interfaces between the cap region a-Si film 103 and the bare region a-Si film 104, toward the central portion of the cap region a-Si film 103.

However, the bare region a-Si film 104 resulted in a microcrystal region where crystal grains were not laterally grown, for the reasons described below. Since the thickness of the heating/cooling suppression films 101 of the comparative example, 53 nm, was smaller than the thickness of the heating/cooling suppression films 101 of embodiment 4, 203 nm or 101 nm, the heating/cooling suppression films 101 of the comparative example did not serve as a cooling suppression film for the cap region a-Si film 103. As a result, the bare region a-Si film 104 was not solidified faster than the cap region a-Si film 103, and thus, lateral growth of crystal grains in the cap region a-Si film 103 on the basis of the bare region a-Si film 104 did not occur. The second laser light having an energy which was greater than the energy for completely-melting the cap region and smaller than the energy for completely-melting the bare region was applied to such an a-Si film, so that only the cap region a-Si film 103 was completely melted. In the completely-melted cap region a-Si film 103, crystal grains were laterally grown on the basis of the bare region a-Si film 104. For such a reason, crystal grains were laterally grown only in the cap region a-Si film 103 as shown in FIG. 32, while the bare region a-Si film 104 resulted in a microcrystal region containing no laterally-grown crystal grains. As a result, regions where crystal grains were laterally grown and microcrystal regions were alternately formed as shown in FIG. 32.

Next, a crystalline semiconductor film was formed using the crystalline semiconductor film production method of embodiment 1, and the crystalline state of the film was compared with that of a crystalline semiconductor film formed using the crystalline semiconductor film production method of embodiment 4.

In the crystalline semiconductor film production method of embodiment 1, a silicon oxide film was formed as a base coat film using a P-CVD method so as to have a thickness of 300 nm over a glass substrate. Then, an a-Si film was formed over the base coat film using a P-CVD method so as to have a thickness of 45 nm. After the formation of the a-Si film and the base coat film, the resultant structure was heated for 1 hour using an electric furnace containing nitrogen atmosphere at 500° C., so that the a-Si film was dehydrogenated.

Thereafter, a silicon oxide film was formed over the a-Si film using a P-CVD method so as to have a thickness of 53 nm. An aluminum film was then sputtered over the silicon oxide film so as to have a thickness of 300 nm. The aluminum film formed over the silicon oxide film was patterned by dry etching using $BCl_3$ so as to obtain a reflection film. The patterned reflection film was then used as a mask to pattern the silicon oxide film by etching using 5 wt % HF so as to obtain an antireflection film. As a result, layered structures including the antireflection film and the reflection film formed into a stripe pattern where the stripes were arranged with an interval of 2 micrometers and each stripe had a width of 2 micrometers were obtained over the a-Si film.

Next, a XeCl laser device emitted first laser light having an energy density of 450 $mJ/cm^2$ at a wavelength of 308 nm over the a-Si film from the side where the antireflection and reflection films were formed. Then, the reflection film was etched away using a SLA etchant containing a phosphoric acid and an acetic acid. Then, second laser light having an energy density of 390 $mJ/cm^2$ was applied over the a-Si film from the side where the antireflection film was formed. For both the first and second laser light, the beam size was 0.5 mm×100 mm; the repetition ratio was 80 Hz; and the stage feed speed was 40 mm/sec. Then, the antireflection film was etched away from the a-Si film using 5 wt % HF.

FIG. 33 is a plan view schematically showing such a crystalline semiconductor film according to embodiment 1 formed by the above method. FIG. 33 shows the crystal state of a crystalline silicon film observed using a SEM after the removal of the antireflection film. In the cap region a-Si film 103, crystal grains were laterally grown from the longitudinal side faces of the cap region a-Si film 103 to the central region thereof. In the bare region a-Si film 104 also, crystal grains were laterally grown from the longitudinal side faces of the bare region a-Si film 104 to the central region thereof. However, as shown in FIG. 33, stain-like spots 194 were formed over the film. These spots 194 were generated by a melted portion of the reflection film made of a metal material which fell on the bare region a-Si film 104, or by an evaporated portion of the reflection film which was attached to the bare region a-Si film 104. That is, these spots indicate contamination of the a-Si film 102.

The thus-produced crystalline silicon film was used to produce an n-channel TFT where a channel was formed along a width direction of the crystal grains (first n-channel TFT), and another n-channel TFT where a channel was formed along the crystal growth direction (second n-channel TFT). In the first n-channel TFT, the carrier mobility was 100 cm$^2$/Vs. In the second n-channel TFT, the carrier mobility was 295 cm$^2$/Vs.

However, a variation in the threshold voltage of the TFTs of embodiment 1 was greater than that of the TFTs of embodiment 4. The percent defective which was determined based on a variation in threshold voltage was 13/100. That is, the threshold voltage was measured for 100 second n-channel TFTs, and 13 defective TFTs were found.

(Embodiment 5 )

In embodiment 5, a production method of a semiconductor device is described, where a crystalline semiconductor film produced according to the crystalline semiconductor film production method of embodiment 4 is used in a channel region of the semiconductor device. FIG. 34 is a plan view illustrating a method for producing thin film transistors according to embodiment 5, where the crystalline semiconductor film is used in channel regions of the transistors. FIG. 35 is a plan view showing thin film transistors according to embodiment 5, where the crystalline semiconductor film is used in channel regions of the transistors.

In the first step, a base coat film is formed over a glass substrate in a similar manner as described in embodiment 4. A a-Si film is then formed over the base coat film. After the formation of the a-Si film and the base coat film, the resultant structure is heated in an electric furnace, whereby the a-Si film is dehydrogenated.

The a-Si film includes generally-rectangular regions 110 and 111 which are provided adjacent to each other. In the region 110, a plurality of heating/cooling suppression films 101 are formed in a stripe pattern with a predetermined interval along the horizontal direction of the sheet of FIG. 34. In the region 111, a plurality of heating/cooling suppression films 101 are formed in a stripe pattern with a predetermined interval along a direction perpendicular to the longitudinal directions of the heating/cooling suppression films 101 in the region 110, i.e., along the vertical direction of the sheet of FIG. 34.

As shown in FIG. 34, the heating/cooling suppression films 101 in the region 110 extend in a direction perpendicular to the direction in which the heating/cooling suppression films 101 in the region 111 extend. In the region 110, the growth direction of crystal grains in the cap region Si film and the bare region Si film is perpendicular to the longitudinal direction of the heating/cooling suppression films 101, i.e., along the vertical direction of the sheet of FIG. 34. In the region 111, the growth direction of crystal grains in the cap region Si film and the bare region Si film is perpendicular to the longitudinal direction of the heating/cooling suppression films 101, i.e., along the horizontal direction of the sheet of FIG. 34. That is, the growth direction of crystal grains in the region 110 is perpendicular to the growth direction of crystal grains in the region 111.

Thus, as shown in FIG. 35, in the region 110, a TFT 112 is formed such that a source region 113 and drain region 114 are vertically arranged along the growth direction of the crystal grains in the Si film, while in the region 111, a TFT 112 is formed such that a source region 113 and drain region 114 are horizontally arranged along the growth direction of the crystal grains in the Si film. In such TFTs 112, channel regions have high carrier mobility. Thus, high performance TFTs can be obtained.

As described above, according to the present invention, a plurality of laterally-grown crystal grains can be formed such that the crystal grains are in contact with each other without leaving a gap therebetween, and each crystal grain has a length equal to or smaller than two times the lateral growth distance of crystals achieved by a single laser light irradiation. Further, laterally-grown crystal grains can be formed in a plurality of directions over the same substrate. In the case where such a semiconductor film is used to produce a semiconductor device, such as a TFT, crystal grains can be formed so as to extend in a desired direction according to the design of the semiconductor device. As a result, a high performance semiconductor device can be produced. Furthermore, such a semiconductor film of the present invention can be produced without high-precision scanning of a laser beam, and therefore, the productivity of the semiconductor film can be improved.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A crystalline semiconductor film, the crystalline semiconductor film being formed over an insulative substrate, and including semiconductor crystal grains laterally grown along a whole plane of a surface of the insulative substrate, wherein the laterally-grown semiconductor crystal grains are in contact with each other at grain boundaries, and a distance between adjacent grain boundaries is equal to or smaller than two times a lateral growth distance of the semiconductor crystal grains.

2. A crystalline semiconductor film according to claim 1, wherein the crystalline semiconductor film includes a plurality of regions such that growth directions of the laterally-grown semiconductor crystal grains in the regions are perpendicular to each other.

3. A crystalline semiconductor film according to claim 1, wherein a part of at least one grain boundary of laterally-grown semiconductor crystal grains is in contact with an amorphous semiconductor film.

4. A method for producing a crystalline semiconductor film, comprising steps of:

forming a semiconductor film on an insulative substrate;

forming layered structures on the semiconductor film in a stripe pattern with a constant interval, the layered structures including an antireflection film for preventing reflection of laser light applied thereon, and a heating prevention film formed on the antireflection film for preventing heating caused by the applied laser light;

applying laser light over the semiconductor film, on which the layered structures including the antireflection film and heating prevention film are provided, thereby crystallizing a portion of the semiconductor film on which the layered structure is not provided;

removing the heating prevention film of each layered structure; and applying laser light over the semiconductor film, on which the striped antireflection film is provided, such that only the semiconductor film under the antireflection film is melted, whereby the semiconductor film under the antireflection film is crystallized.

5. A method for producing a crystalline semiconductor film according to claim 4, wherein the heating prevention film is a reflection film for laser light, made of aluminum, chromium, or tungsten.

6. A method for producing a crystalline semiconductor film according to claim 4, wherein the heating prevention film is a silicon nitride film having a predetermined thickness.

7. A method for producing a crystalline semiconductor film according to claim 5, wherein the reflectance of the reflection film is 90% or more.

8. A method for producing a crystalline semiconductor film according to claim 4, wherein the antireflection film is formed of a silicon oxide film or a silicon nitride film.

9. A method for producing a crystalline semiconductor film according to claim 8, wherein the reflectance of the antireflection film for laser light is smaller than the reflectance of the laser light of the semiconductor film on which the antireflection film is not provided by 20% or more.

10. A method for producing a crystalline semiconductor film according to claim 4, further comprising a step of applying energy to the semiconductor film formed over the insulative substrate such that the semiconductor film is crystallized, prior to the step of applying laser light to the semiconductor film.

11. A method for producing a crystalline semiconductor film according to claim 10, wherein the step of applying energy to the semiconductor film such that the semiconductor film is crystallized is performed prior to the step of forming the layered structure.

12. A method for producing a crystalline semiconductor film according to claim 10, wherein the energy for crystallizing the semiconductor film is supplied by heating the semiconductor thin film in an electric furnace.

13. A method for producing a crystalline semiconductor film according to claim 10, wherein the energy for crystallizing the semiconductor film is supplied by irradiation with laser light.

14. A method for producing a crystalline semiconductor film, comprising steps of:

forming a semiconductor film on an insulative substrate;

forming a cap film on the semiconductor film in a stripe pattern so as to have a predetermined thickness;

applying over the semiconductor film first laser light having a wavelength which allows the cap film to function as a heating prevention film, thereby crystallizing a portion of the semiconductor film on which the cap film is not provided; and applying over the semiconductor film second laser light having a wavelength which allows the cap film to function as an antireflection film, thereby crystallizing a portion of the semiconductor film on which the cap film is provided.

15. A method for producing a crystalline semiconductor film according to claim 14, wherein:

the wavelength of the first laser light is set such that a thermal energy which is caused by the irradiation with the first laser light and which reaches the portion of the semiconductor film on which the cap film is provided is smaller than a thermal energy which is caused by the irradiation with the first laser light and which reaches the portion of the semiconductor film on which the cap film is not provided; and the wavelength of the second laser light is set such that a thermal energy which is caused by the irradiation with the second laser light and which reaches the portion of the semiconductor film on which the cap film is provided is larger than a thermal energy which is caused by the irradiation with the second laser light and which reaches the portion of the semiconductor film on which the cap film is not provided.

16. A method for producing a crystalline semiconductor film according to claim 14, wherein the thickness of the cap film is set such that:

the cap film functions as the heating prevention film when the first laser light is applied; and the cap film functions as the antireflection film when the second laser light is applied.

17. A method for producing a crystalline semiconductor film according to claim 14, wherein the steps of applying the first and second laser light over the semiconductor film to crystallize the semiconductor film are performed sequentially as different process steps.

18. A method for producing a crystalline semiconductor film according to claim 14, wherein the steps of applying the first and second laser light over the semiconductor film to crystallize the semiconductor film are concurrently performed in a single laser light scanning operation, using first and second laser light sources arranged in parallel such that the first and second laser light irradiate different regions over the semiconductor film.

19. A method for producing a crystalline semiconductor film according to claim 14, wherein:

the first and second laser light are pulsed laser light; and the steps of applying the first and second laser light over the semiconductor film to crystallize the semiconductor film are concurrently realized in a single laser light scanning operation by alternately applying the first and second laser light over the semiconductor film from the same laser light irradiation position.

20. A method for producing a crystalline semiconductor film by crystallizing a semiconductor film, comprising:

a semiconductor film formation step of forming a semiconductor film over an insulative substrate;

a heating/cooling suppression film formation step of forming a plurality of heating/cooling suppression films in a stripe pattern with a predetermined interval so as to have a same predetermined thickness;

a first irradiation step of applying first laser light on the semiconductor film from a side where the heating/cooling suppression films are formed, such that a cap region semiconductor film covered with the heating/cooling suppression films and a bare region semiconductor film not covered with the heating/cooling suppression films are completely melted;

a cap region crystallizing step of crystallizing the completely-melted cap region semiconductor film on the basis of the bare region semiconductor film;

after the cap region crystallizing step, a second irradiation step of applying second laser light on the semiconductor film from a side where the heating/cooling suppression films are formed, such that only the bare region semiconductor film is completely melted;

a bare region crystallizing step of crystallizing the completely-melted bare region semiconductor film on the basis of the cap region semiconductor film; and a removal step of removing the heating/cooling suppression films from the semiconductor film.

21. A method for producing a crystalline semiconductor film according to claim 20, wherein:
the predetermined thickness of each heating/cooling suppression film is such that an energy required for completely melting the cap region semiconductor film is greater than an energy required for completely melting the bare region semiconductor film;
the first laser light has an energy greater than the energy for completely-melting the cap region; and
the second laser light has an energy greater than the energy for completely-melting the bare region and smaller than the energy for completely-melting the cap region.

22. A method for producing a crystalline semiconductor film according to claim 20, wherein the thickness of the heating/cooling suppression film is set to be equal to or greater than $(3\lambda)/(8n)$, where $\lambda$ denotes the wavelength of the first and second laser light, and n denotes the refractive index of the heating/cooling suppression film.

23. A method for producing a crystalline semiconductor film according to claim 20, wherein the heating/cooling suppression film is formed of a silicon oxide film.

24. A method for producing a crystalline semiconductor film according to claim 20, wherein the heating/cooling suppression film is formed of any of a silicon oxide film or a layered film including a silicon oxide film and a silicon nitride film.

25. A method for producing a crystalline semiconductor film according to claim 20, wherein:
in the cap region crystallizing step, the cap region semiconductor film is crystallized in such a manner that semiconductor crystal grains in the cap region semiconductor film laterally grow from longitudinal side faces of the cap region semiconductor film which are in contact with adjacent bare region semiconductor films toward a central portion of the cap region semiconductor film; and
in the bare region crystallizing step, the bare region semiconductor film is crystallized in such a manner that semiconductor crystal grains in the bare region semiconductor film laterally grow from longitudinal side faces of the bare region semiconductor film which are in contact with adjacent cap region semiconductor films toward a central portion of the bare region semiconductor film.

26. A semiconductor device, comprising a crystalline semiconductor film formed over an insulative substrate as an active region of the semiconductor device, and the crystalline semiconductor film including semiconductor crystal grains laterally grown along a surface of the insulative substrate, wherein
in the crystalline semiconductor film, the laterally-grown semiconductor crystal grains are in contact with each other at grain boundaries, and a distance between adjacent grain boundaries is equal to or smaller than two times a lateral growth distance of the semiconductor crystal grains.

27. A semiconductor device according to claim 26, wherein the crystalline semiconductor film includes a plurality of regions such that growth directions of the laterally-grown semiconductor crystal grains in the regions are perpendicular to each other.

28. The semiconductor device according to claim 26, wherein in the crystalline semiconductor film, a part of a grain boundary of the laterally-grown semiconductor crystal grains is in contact with an amorphous semiconductor film.

29. A method for producing a semiconductor device including a crystalline semiconductor film on an insulative substrate as an active region of the semiconductor device, the crystalline semiconductor film being obtained by irradiating a semiconductor film with laser light a plurality of times so that semiconductor crystal grains laterally grow along a surface of the insulative substrate, the method comprising steps of:
forming a semiconductor film over an insulative substrate;
forming layered structures on the semiconductor film in a stripe pattern with a constant interval, the layered structures including an antireflection film for preventing reflection of the laser light applied thereon, and a heating prevention film formed on the antireflection film for preventing heating caused by the applied laser light;
applying the laser light over the semiconductor film, on which the layered structures including the antireflection film and heating prevention film are provided, thereby crystallizing a portion of the semiconductor film on which the layered structure is not provided;
removing the heating prevention film of each layered structure; and
applying laser light over the semiconductor film, on which the striped antireflection film is provided, such that only the semiconductor film under the antireflection film is melted, whereby the semiconductor film under the antireflection film is crystallized.

30. A method for producing a semiconductor device including a crystalline semiconductor film on an insulative substrate as an active region of the semiconductor device, the crystalline semiconductor film being obtained by irradiating a semiconductor film with laser light so that semiconductor crystal grains laterally grow along a surface of the insulative substrate, the method comprising steps of:
forming the semiconductor film over the insulative substrate;
forming a cap film on the semiconductor film in a stripe pattern so as to have a predetermined thickness;
applying over the semiconductor film first laser light having a wavelength which allows the cap film to function as a heating prevention film, thereby crystallizing a portion of the semiconductor film on which the cap film is not provided; and
applying over the semiconductor film second laser light having a wavelength which allows the cap film to function as an antireflection film, thereby crystallizing a portion of the semiconductor film on which the cap film is provided.

31. A method for producing a semiconductor device including a crystalline semiconductor film as a channel region of the semiconductor device, the crystalline semiconductor film being obtained by crystallizing a semiconductor film, the method comprising:
a semiconductor film formation step of forming a semiconductor film over an insulative substrate;
a heating/cooling suppression film formation step of forming a plurality of heating/cooling suppression films in a stripe pattern with a predetermined interval so as to have a same predetermined thickness;
a first irradiation step of applying first laser light on the semiconductor film from a side where the heating/cooling suppression films are formed, such that a cap region semiconductor film covered with the heating/cooling suppression films and a bare region semiconductor film not covered with the heating/cooling suppression films are completely melted;

a cap region crystallizing step of crystallizing the completely-melted cap region semiconductor film on the basis of the bare region semiconductor film;

after the cap region crystallizing step, a second irradiation step of applying second laser light on the semiconductor film from a side where the heating/cooling suppression films are formed, such that only the bare region semiconductor film is completely melted;

a bare region crystallizing step of crystallizing the completely-melted bare region semiconductor film on the basis of the cap region semiconductor film; and a removal step of removing the heating/cooling suppression films from the semiconductor film.

32. A method for producing a semiconductor device including a crystalline semiconductor film as a channel region of the semiconductor device, the crystalline semiconductor film being obtained by crystallizing a semiconductor film, the method comprising:

a semiconductor film formation step of forming a semiconductor film over an insulative substrate;

a heating/cooling suppression film formation step of forming, in a first region on the semiconductor film, a plurality of first heating/cooling suppression films in a stripe pattern with a predetermined interval so as to have a same predetermined thickness, and forming, in a second region on the semiconductor film, a plurality of second heating/cooling suppression films in a stripe pattern with a predetermined interval so as to have a same predetermined thickness along a direction perpendicular to the longitudinal direction of the first heating/cooling suppression films;

a first irradiation step of applying first laser light on the semiconductor film from a side where the heating/cooling suppression films are formed, such that a cap region semiconductor film covered with the first and second heating/cooling suppression films and a bare region semiconductor film not covered with the first or second heating/cooling suppression films are completely melted;

a cap region crystallizing step of crystallizing the completely-melted cap region semiconductor film on the basis of the bare region semiconductor film;

after the cap region crystallizing step, a second irradiation step of applying second laser light on the semiconductor film from a side where the first and second heating/cooling suppression films are formed, such that only the bare region semiconductor film is completely melted;

a bare region crystallizing step of crystallizing the completely-melted bare region semiconductor film on the basis of the cap region semiconductor film; and a removal step of removing the first and second heating/cooling suppression films from the semiconductor film.

* * * * *